(12) United States Patent
Moue

(10) Patent No.: US 10,917,107 B2
(45) Date of Patent: Feb. 9, 2021

(54) ANALOG-DIGITAL CONVERTER, SOLID-STATE IMAGE SENSING DEVICE, AND ELECTRONIC SYSTEM

(71) Applicant: SONY SEMICONDUCTOR SOLUTIONS CORPORATION, Kanagawa (JP)

(72) Inventor: Takashi Moue, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/476,429

(22) PCT Filed: Nov. 21, 2017

(86) PCT No.: PCT/JP2017/041840
§ 371 (c)(1),
(2) Date: Jul. 8, 2019

(87) PCT Pub. No.: WO2018/135125
PCT Pub. Date: Jul. 26, 2018

(65) Prior Publication Data
US 2020/0059240 A1 Feb. 20, 2020

(30) Foreign Application Priority Data

Jan. 17, 2017 (JP) .................................. 2017-005640

(51) Int. Cl.
*H04N 5/378* (2011.01)
*H03M 3/00* (2006.01)
*H04N 5/357* (2011.01)

(52) U.S. Cl.
CPC ........... *H03M 3/368* (2013.01); *H03M 3/464* (2013.01); *H04N 5/3575* (2013.01); *H04N 5/378* (2013.01)

(58) Field of Classification Search
CPC ............................ H03M 3/464; H04N 5/378
(Continued)

(56) References Cited

U.S. PATENT DOCUMENTS

| 9,866,227 B1* | 1/2018 | Bresciani ............ H03M 1/1009 |
| 2014/0022430 A1* | 1/2014 | Ueno ..................... H01L 21/822 |
| | | 348/308 |

(Continued)

FOREIGN PATENT DOCUMENTS

| JP | 2012-165088 A | 8/2012 |
| JP | 2016-039392 A | 3/2016 |

(Continued)

OTHER PUBLICATIONS

International Search Report and Written Opinion of PCT Application No. PCT/JP2017/041840, dated Feb. 13, 2018, 11 pages of ISRWO.

*Primary Examiner* — Anthony J Daniels
(74) *Attorney, Agent, or Firm* — Chip Law Group

(57) ABSTRACT

Included are an integration circuit unit integrating a difference between a value of an analog input signal and a feedback value, a quantization circuit unit converting an output of the integration circuit unit into a digital value, a first current-steering digital-analog converting unit generating the feedback value in accordance with an output of the quantization circuit unit, and a second current-steering digital-analog converting unit differing from the first current-steering digital-analog converting unit. Also, an output terminal of the first current-steering digital-analog converting unit or an output terminal of the second current-steering digital-analog converting unit is connected to an input terminal of the integration circuit unit.

14 Claims, 15 Drawing Sheets

(58) Field of Classification Search
USPC .......................................................... 348/241
See application file for complete search history.

(56) References Cited

U.S. PATENT DOCUMENTS

| | | | | |
|---|---|---|---|---|
| 2014/0266829 | A1* | 9/2014 | Pinna | H03M 3/30 |
| | | | | 341/143 |
| 2015/0249801 | A1* | 9/2015 | Tokunaga | H03M 3/458 |
| | | | | 341/155 |
| 2016/0006452 | A1* | 1/2016 | Saito | G01R 19/2509 |
| | | | | 348/302 |
| 2016/0028978 | A1* | 1/2016 | Yu | H04N 5/365 |
| | | | | 348/241 |
| 2016/0126973 | A1 | 5/2016 | Mitani et al. | |

FOREIGN PATENT DOCUMENTS

| | | |
|---|---|---|
| JP | 2016-225970 A | 12/2016 |
| WO | 2015/004829 A1 | 1/2015 |
| WO | 2015/107575 A1 | 7/2015 |
| WO | 2016/021266 A1 | 2/2016 |
| WO | 2016/194339 A1 | 12/2016 |

\* cited by examiner

ANALOG-DIGITAL CONVERTER, SOLID-STATE IMAGE SENSING DEVICE, AND ELECTRONIC SYSTEM

CROSS REFERENCE TO RELATED APPLICATIONS

This application is a U.S. National Phase of International Patent Application No. PCT/JP2017/041840 filed on Nov. 21, 2017, which claims priority benefit of Japanese Patent Application No. JP 2017-005640 filed in the Japan Patent Office on Jan. 17, 2017. Each of the above-referenced applications is hereby incorporated herein by reference in its entirety.

TECHNICAL FIELD

The present disclosure relates to an analog-digital converter, a solid-state image sensing device, and an electronic system.

BACKGROUND ART

As one of analog-digital converters (AD converters), a delta-sigma analog-digital converter is known, for example (for example, refer to Patent Document 1). In a continuous-time delta-sigma analog-digital converter out of the delta-sigma analog-digital converters, there is a case where a low-frequency noise is generated infrequently from a current source of a current-steering digital-analog converting unit (DA converting unit) in a feedback loop. Also, in a plural-order delta-sigma analog-digital converter, a low-frequency noise generated from a current source of a current-steering digital-analog converting unit connected to a first-stage integrator is included in an output of the analog-digital converter as it is without being subject to a noise reduction effect exerted by delta-sigma modulation.

There is a case where a transistor in which a random telegraph noise out of low-frequency noises is particularly high appears infrequently in a specific sample among multiple samples. In a case where the delta-sigma analog-digital converter is used as an analog-digital converter for a column processing unit of a CMOS image sensor, for example, this random telegraph noise is generated as a vertical-striped random noise and causes degradation of image quality. Note that the problem caused by the random telegraph noise does not occur only in a case where the delta-sigma analog-digital converter is used for the CMOS image sensor.

CITATION LIST

Patent Document

Patent Document 1: Japanese Patent Application Laid-Open No. 2012-165088

SUMMARY OF THE INVENTION

Problems to be Solved by the Invention

The random telegraph noise is a kind of random noise observed in a miniaturized transistor. Accordingly, a general way to reduce the random telegraph noise is to increase the area of a transistor serving as a current source of a current-steering digital-analog converting unit provided in a feedback loop (hereinbelow referred to as "a current source transistor" in some cases). However, in a case where the area of the current source transistor is increased, the area of the analog-digital converter increases.

Another way that can be raised is a way to design an operating point so that transconductance $g_m$ of the current source transistor may be relatively low to decrease a conversion gain from noise voltage generated at a gate of the current source transistor of the current-steering digital-analog converting unit into output current. However, in this case, since employing the way causes overdriving voltage of the current source transistor to be relatively high, the dynamic range of the delta-sigma analog-digital converter and the allowable signal amplitude of the integrator are easily reduced.

An object of the present disclosure is to provide an analog-digital converter enabling a random telegraph noise to be reduced without the need to increase the area of a current source transistor of a current-steering digital-analog converting unit and to design an operating point so that transconductance $g_m$ may be relatively low. Another object of the present disclosure is to provide a solid-state image sensing device using the analog-digital converter and an electronic system including the solid-state image sensing device.

Solutions to Problems

To achieve the above object, an analog-digital converter according to the present disclosure includes:

an integration circuit unit integrating a difference between a value of an analog input signal and a feedback value;

a quantization circuit unit converting an output of the integration circuit unit into a digital value;

a first current-steering digital-analog converting unit generating the feedback value in accordance with an output of the quantization circuit unit; and a second current-steering digital-analog converting unit differing from the first current-steering digital-analog converting unit.

An output terminal of the first current-steering digital-analog converting unit or an output terminal of the second current-steering digital-analog converting unit is connected to an input terminal of the integration circuit unit.

To achieve the above object, a solid-state image sensing device according to the present disclosure includes:

a pixel array unit including unit pixels each including a photoelectric conversion unit arranged in a matrix form; and a column processing unit including an analog-digital converter converting an analog pixel signal output from the unit pixel into a digital pixel signal.

As the analog-digital converter, the analog-digital converter configured as above is used. Furthermore, to achieve the above object, an electronic system according to the present disclosure includes the solid-state image sensing device configured as above.

In a case where the analog-digital converter configured as above includes the second current-steering digital-analog converting unit as well as the first current-steering digital-analog converting unit, the probability that both of the random telegraph noises at current sources of the converting units get worse is drastically low. The reason for this is that a transistor in which a random telegraph noise is particularly high appears infrequently. Under such circumstances, the output terminal of the current-steering digital-analog converting unit which generates a lower random telegraph noise from the current source is connected to the input terminal of the integration circuit unit, or the output terminals of both the current-steering digital-analog converting units are connected alternately. Accordingly, the random telegraph noise can be reduced further than in a case where the output terminal of the current-steering digital-analog converting unit which generates a higher random telegraph noise is connected to the input terminal of the integration circuit unit.

Effects of the Invention

According to the present disclosure, a random telegraph noise can be reduced without the need to increase the area of a current source transistor of a current-steering digital-analog converting unit and to design an operating point so that transconductance $g_m$ may be relatively low. Note that the effects of the present disclosure are not limited to those described herein but may be any effects described in the present description. Furthermore, the effects described in the present description are illustrative only. The effects of the present disclosure are not limited to those described in the present description and may include additional effects.

MODE FOR CARRYING OUT THE INVENTION

Figure 1:
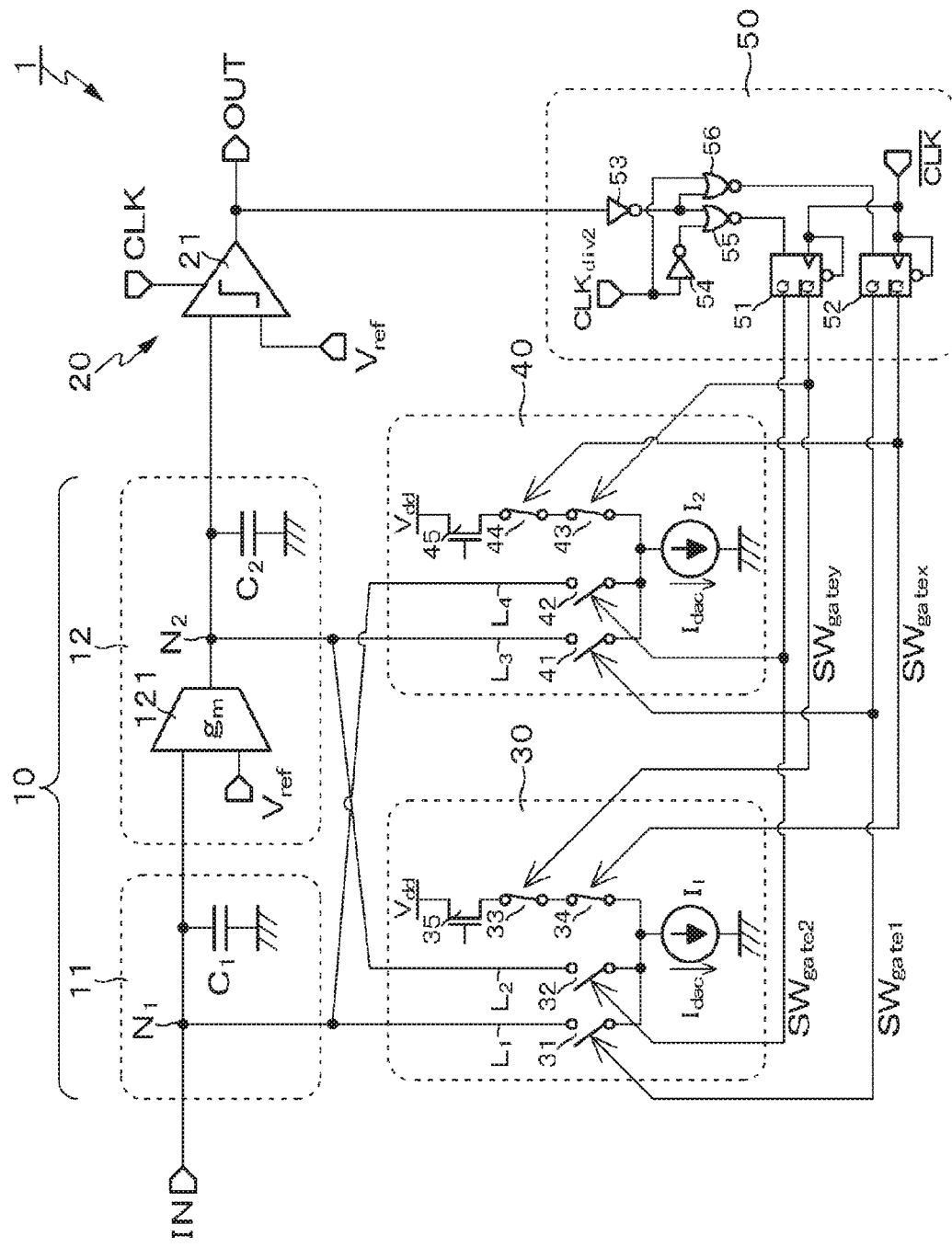
FIG. 1 is a circuit diagram illustrating an overview of a circuit configuration of a continuous-time delta-sigma analog-digital converter according to Example 1.

Hereinbelow, a mode for carrying out the technique according to the present disclosure (hereinbelow referred to as "an embodiment") will be described in detail with reference to the drawings. The technique according to the present disclosure is not limited to the embodiment. In the following description, identical components or components having identical functions are denoted with the same reference signs, and description of the duplicate components is omitted. Note that description will be provided in the following order.

1. General Description of Analog-Digital Converter, Solid-State Image Sensing Device, and Electronic System According to Present Disclosure
2. Analog-Digital Converter According to Present Disclosure
  2-1. Example 1 (Example of Second-Order Delta-Sigma Analog-Digital Converter)
  2-2. Example 2 (Modification Example of Example 1: Example in Which Circuit Configuration of Control Circuit Unit Differs)
  2-3. Example 3 (Modification Example of Example 2: Example in Which Type of First-Stage Integrator Differs)
  2-4. Example 4 (Example in Which Second Current-Steering Digital-Analog Converting Unit is Provided as Backup)
  2-5. Example 5 (Modification Example of Example 4)
  2-6. Example 6 (Example of Third-Order Delta-Sigma Analog-Digital Converter)
  2-7. Modification Example
3. Solid-State Image Sensing Device According to Present Disclosure (Example of CMOS Image Sensor)
  3-1. Basic System Configuration
  3-2. Example 7 (Example of Using Current-Steering Digital-Analog Converting Unit Belonging to Analog-Digital Converter in Adjacent Pixel Column)
  3-3. Stacked Structure
4. Electronic System According to Present Disclosure (Example of Image Sensing Apparatus)
5. Configurations That Present Disclosure Can Employ
  <General Description of Analog-Digital Converter, Solid-State Image Sensing Device, and Electronic System According to Present Disclosure>

An analog-digital converter, a solid-state image sensing device, and an electronic system according to the present disclosure can employ a mode in which a second current-steering digital-analog converting unit is provided in the same analog-digital converter as that provided with a first current-steering digital-analog converting unit.

In the analog-digital converter, the solid-state image sensing device, and the electronic system according to the present disclosure having the aforementioned preferred configuration and mode, an integration circuit unit can include at least two integrators connected in a cascaded manner. In this case, the first current-steering digital-analog converting unit is preferably a digital-analog converting unit giving a feedback value to the integrator on a first stage of the integration circuit unit, and the second current-steering digital-analog converting unit is preferably a digital-analog converting unit giving the feedback value to the integrator on a second stage of the integration circuit unit.

Moreover, in the analog-digital converter, the solid-state image sensing device, and the electronic system according to the present disclosure having the aforementioned preferred configuration and mode, the first current-steering digital-analog converting unit can include a first switch element selectively connected at an output terminal thereof to the integrator on the first stage and a second switch element selectively connected at the output terminal thereof to the integrator on the second stage. Furthermore, the second current-steering digital-analog converting unit can include a third switch element selectively connected at an output terminal thereof to the integrator on the second stage and a fourth switch element selectively connected at the output terminal thereof to the integrator on the first stage.

Moreover, in the analog-digital converter, the solid-state image sensing device, and the electronic system according to the present disclosure having the aforementioned preferred configuration and mode, a control circuit unit performing switching control between a first connection mode and a second connection mode can be included. The first connection mode is a connection mode in which the output terminal of the first current-steering digital-analog converting unit is connected to the integrator on the first stage via the first switch element and in which the output terminal of the second current-steering digital-analog converting unit is connected to the integrator on the second stage via the third switch element. The second connection mode is a connection mode in which the output terminal of the first current-steering digital-analog converting unit is connected to the integrator on the second stage via the second switch element and in which the output terminal of the second current-steering digital-analog converting unit is connected to the integrator on the first stage via the fourth switch element.

Moreover, in the analog-digital converter, the solid-state image sensing device, and the electronic system according to the present disclosure having the aforementioned preferred configuration and mode, the control circuit unit can perform switching control between the first connection mode and the second connection mode in an alternate manner in synchronization with quantization operation of a quantization circuit unit.

Moreover, in the analog-digital converter, the solid-state image sensing device, and the electronic system according to the present disclosure having the aforementioned preferred configuration and mode, a plurality of the second current-steering digital-analog converting units is provided in the same analog-digital converter as that provided with the first current-steering digital-analog converting unit. In this case, the output terminal of the digital-analog converting unit generating the lowest random telegraph noise among the first current-steering digital-analog converting unit and the plurality of second current-steering digital-analog converting units is preferably connected to an input terminal of the integration circuit unit. Furthermore, a switch circuit part of the first current-steering digital-analog converting unit can be used in common by the first current-steering digital-analog converting unit and the second current-steering digital-analog converting unit.

Moreover, in the analog-digital converter, the solid-state image sensing device, and the electronic system according to the present disclosure having the aforementioned preferred configuration and mode, the second current-steering digital-analog converting unit can be provided in an analog-digital converter adjacent to the analog-digital converter provided with the first current-steering digital-analog converting unit.

Alternatively, in the solid-state image sensing device according to the present disclosure having the aforementioned preferred configuration and mode, the second current-steering digital-analog converting unit can be provided in an adjacent analog-digital converter in a column processing unit. The analog-digital converter may be provided per pixel column, or the analog-digital converter may be provided per group of a plurality of pixel columns and may be used among the plurality of pixel columns on a time division basis. Accordingly, in a case where the analog-digital converter is provided per pixel column, for example, a digital-analog converting unit provided in an analog-digital converter on an adjacent pixel column is preferably used as the second current-steering digital-analog converting unit.

Moreover, the solid-state image sensing device according to the present disclosure having the aforementioned preferred configuration and mode can have a so-called stacked structure in which a semiconductor substrate provided with a pixel array unit and a semiconductor substrate provided with the column processing unit including the analog-digital converter are stacked.

<Analog-Digital Converter According to Present Disclosure>

An analog-digital converter (AD converter) according to the present disclosure is a continuous-time delta-sigma analog-digital converter including a current-steering digital-analog converting unit (DA converting unit) in a feedback loop. The continuous-time delta-sigma analog-digital converter according to the present embodiment is provided to reduce particularly a random telegraph noise included in an output of the analog-digital converter as it is without being subject to a noise reduction effect exerted by delta-sigma modulation, out of low-frequency noises generated from a current source of the current-steering digital-analog converting unit.

More specifically, the continuous-time delta-sigma analog-digital converter according to the present embodiment achieves reduction of the random telegraph noise without the need to increase the area of a current source transistor of the current-steering digital-analog converting unit and to design an operating point so that transconductance $g_m$ of the current source transistor may be relatively low. Hereinbelow, specific examples of a continuous-time delta-sigma analog-digital converter according to the present embodiment adapted to achieve reduction of the random telegraph noise will be described.

Example 1

Example 1 is an example of a second-order delta-sigma analog-digital converter. An overview of a circuit configuration of a continuous-time delta-sigma analog-digital converter according to Example 1 is illustrated in FIG. 1.

As illustrated in FIG. 1, a continuous-time delta-sigma analog-digital converter 1 according to Example 1 includes an integration circuit unit 10, a quantization circuit unit 20, a first current-steering digital-analog converting unit 30, a second current-steering digital-analog converting unit 40, and a control circuit unit 50. The first current-steering digital-analog converting unit 30 and the second current-steering digital-analog converting unit 40 are provided in a feedback loop of the delta-sigma analog-digital converter 1.

The integration circuit unit 10 includes two cascaded integrators, that is, a first-stage integrator 11 and a second-stage integrator 12, and integrates a difference between a value of an analog input signal IN and a feedback value. The first-stage integrator 11 includes a capacitive element $C_1$ connected between an input terminal $N_1$ of the integrator 11 and a reference potential point (for example, a GND). The second-stage integrator 12 includes a $g_m$ amplifier 121 converting voltage into current and includes a capacitive element $C_2$ connected between an output terminal $N_2$ of the $g_m$ amplifier 121 (an input terminal of the integrator 12) and the reference potential point (for example, the GND).

The quantization circuit unit 20 includes a comparator 21, for example. The quantization circuit unit 20 compares an output of the integration circuit unit 10 with reference voltage $V_{ref}$ in synchronization with a clock signal CLK, thereby quantifying the output of the integration circuit unit 10 and outputs the output as a 1-bit digital signal OUT. From the 1-bit digital signal OUT, components other than components in a required frequency band are removed by a not-illustrated subsequent-stage low-frequency pass filter (digital filter), and the digital signal OUT is converted into a digital signal.

The first current-steering digital-analog converting unit 30 generates a feedback value in accordance with an output of the quantization circuit unit 20 and supplies the feedback value to the first-stage integrator 11. Specifically, the first current-steering digital-analog converting unit 30 includes a current source $I_1$ and a differential switch circuit including four switch elements 31 to 34.

One end of each of the four switch elements 31 to 34 is connected to an input terminal of the current source $I_1$ in common. The other end of the switch element 31 serving as a first switch element is electrically connected to the input terminal $N_1$ of the first-stage integrator 11 via a line $L_1$. The other end of the switch element 32 serving as a second switch element is electrically connected to the input terminal $N_2$ of the second-stage integrator 12 via a line $L_2$.

The switch elements 33 and 34 are connected in series with each other and are connected to a node of a power supply $V_{dd}$ via a transistor 35. Predetermined bias voltage is applied to the gate of the transistor 35 to cause the transistor 35 to function as a load element.

The second current-steering digital-analog converting unit 40 is provided in the delta-sigma analog-digital converter 1 in a similar manner to the first current-steering digital-analog converting unit 30, generates a feedback value in accordance with an output of the quantization circuit unit 20, and supplies the feedback value to the second-stage integrator 12. Specifically, the second current-steering digital-analog converting unit 40 includes a current source $I_2$ and a differential switch circuit including four switch elements 41 to 44.

One end of each of the four switch elements 41 to 44 is connected to an input terminal of the current source $I_2$ in common. The other end of the switch element 41 serving as a third switch element is electrically connected to the input terminal $N_2$ of the second-stage integrator 12 via a line $L_3$. The other end of the switch element 42 serving as a fourth switch element is electrically connected to the input terminal $N_1$ of the first-stage integrator 11 via a line $L_4$.

The switch elements 43 and 44 are connected in series with each other and are connected to the node of the power supply $V_{dd}$ via a transistor 45. Predetermined bias voltage is applied to the gate of the transistor 45 to cause the transistor 45 to function as a load element.

The control circuit unit 50 performs switching control between a connection mode of the four switch elements 31 to 34 of the first current-steering digital-analog converting unit 30 and a connection mode of the four switch elements 41 to 44 of the second current-steering digital-analog converting unit 40 in synchronization with operation of the quantization circuit unit 20. Specifically, the control circuit unit 50 includes two D flip-flops 51 and 52, two inverter circuits 53 and 54, and two NOR circuits 55 and 56.

The flip-flop 51 uses a Q output as a switching control signal $SW_{gate2}$ for the switch element 32 of the first current-steering digital-analog converting unit 30 and the switch element 42 of the second current-steering digital-analog converting unit 40. The flip-flop 51 also uses an inversion output of the Q output as a switching control signal $SW_{gatey}$ for the switch element 34 of the first current-steering digital-analog converting unit 30 and the switch element 44 of the second current-steering digital-analog converting unit 40.

The flip-flop 52 uses a Q output as a switching control signal $SW_{gate1}$ for the switch element 31 of the first current-steering digital-analog converting unit 30 and the switch element 41 of the second current-steering digital-analog converting unit 40. The flip-flop 52 also uses an inversion output of the Q output as a switching control signal $SW_{gatex}$ for the switch element 33 of the first current-steering digital-analog converting unit 30 and the switch element 43 of the second current-steering digital-analog converting unit 40.

The inverter circuit 53 inverts the polarity of an output signal of the comparator 21 and supplies the output signal as one input of each of the two NOR circuits 55 and 56. The inverter circuit 54 inverts the polarity of a clock signal $CLK_{div2}$ obtained by dividing the frequency of the clock signal CLK, which is a reference of operation of the comparator 21, by ½ (the cycle is twice). The NOR circuit 55 receives the clock signal $CLK_{div2}$ polarity-inverted at the inverter circuit 54 as the other input thereof. The NOR circuit 56 directly receives the clock signal $CLK_{div2}$ as the other input thereof.

An output of the NOR circuit 55 becomes a D input of the flip-flop 51. An output of the NOR circuit 56 becomes a D input of the flip-flop 52. The flip-flop 51 and the flip-flop 52 receive as clock inputs reversed-phase clock signals of the clock signal CLK, which is a reference of operation of the comparator 21.

The control circuit unit 50 having the aforementioned circuit configuration performs alternate switching control between a first connection mode and a second connection mode in the first current-steering digital-analog converting unit 30 and the second current-steering digital-analog converting unit 40 in synchronization with operation of the quantization circuit unit 20.

Here, the first connection mode is a connection mode in which an output terminal of the first current-steering digital-analog converting unit 30 is connected to the first-stage integrator 11 via the switch element 31 and in which an output terminal of the second current-steering digital-analog converting unit 40 is connected to the second-stage integrator 12 via the switch element 41. Switching to the first connection mode is executed under control by means of the switching control signal $SW_{gate1}$.

The second connection mode is a connection mode in which the output terminal of the first current-steering digital-analog converting unit 30 is connected to the second-stage integrator 12 via the switch element 32 and in which the output terminal of the second current-steering digital-analog converting unit 40 is connected to the first-stage integrator 11 via the switch element 42. Switching to the second connection mode is executed under control by means of the switching control signal $SW_{gate2}$.

Figure 2:
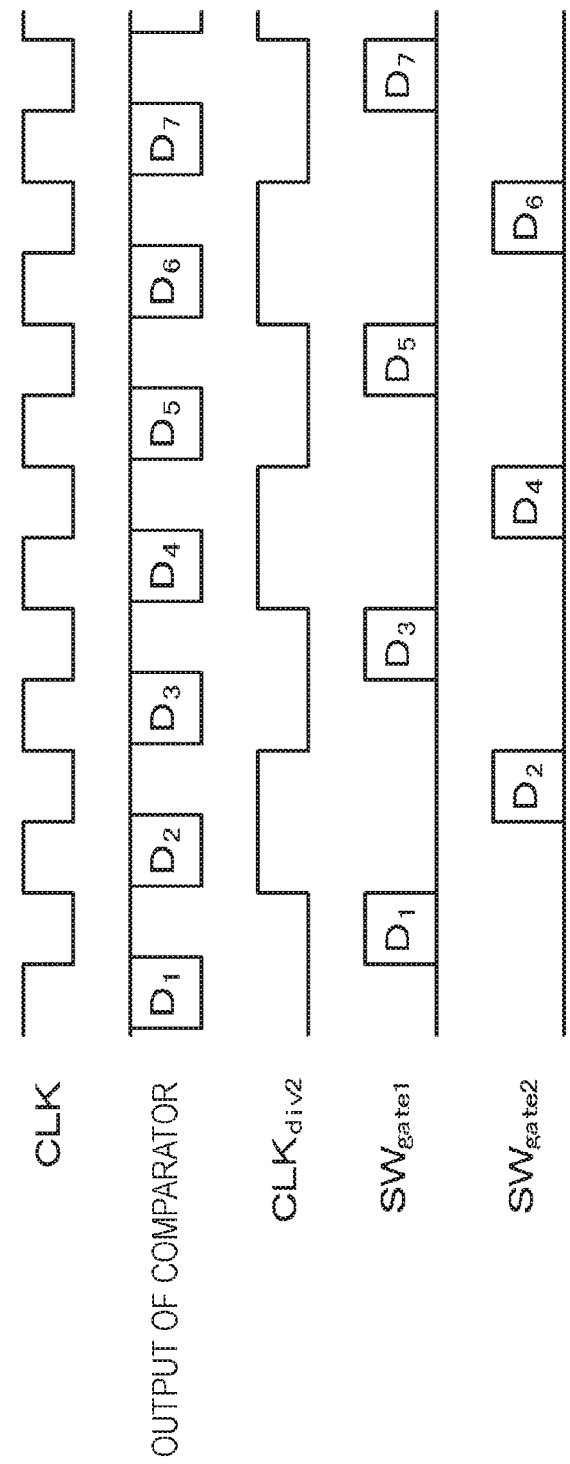
FIG. 2 is a timing waveform chart of signals at respective parts of the continuous-time delta-sigma analog-digital converter according to Example 1.

A timing waveform chart of signals at respective parts of the continuous-time delta-sigma analog-digital converter according to Example 1 is illustrated in FIG. 2. FIG. 2 illustrates timing waveforms of the clock signal CLK, which is a reference of operation of the comparator 21, the output of the comparator 21, the clock signal $CLK_{div2}$ obtained by dividing the frequency of the clock signal CLK by ½, the switching control signal $SW_{gate1}$ to the first connection mode, and the switching control signal $SW_{gate2}$ to the second connection mode.

In a state in which the clock signal $CLK_{div2}$ is in a high (H) level, the control circuit unit 50 turns the switch element 31 of the first current-steering digital-analog converting unit 30 and the switch element 41 of the second current-steering digital-analog converting unit 40 to an on (closed) state or an off (open) state by means of the switching control signal $SW_{gate1}$ depending on the output signal of the comparator 21. The control circuit unit 50 also turns the switch element 32 of the first current-steering digital-analog converting unit 30 and the switch element 42 of the second current-steering digital-analog converting unit 40 to an off (open) state by means of the switching control signal $SW_{gate2}$.

Figure 3:
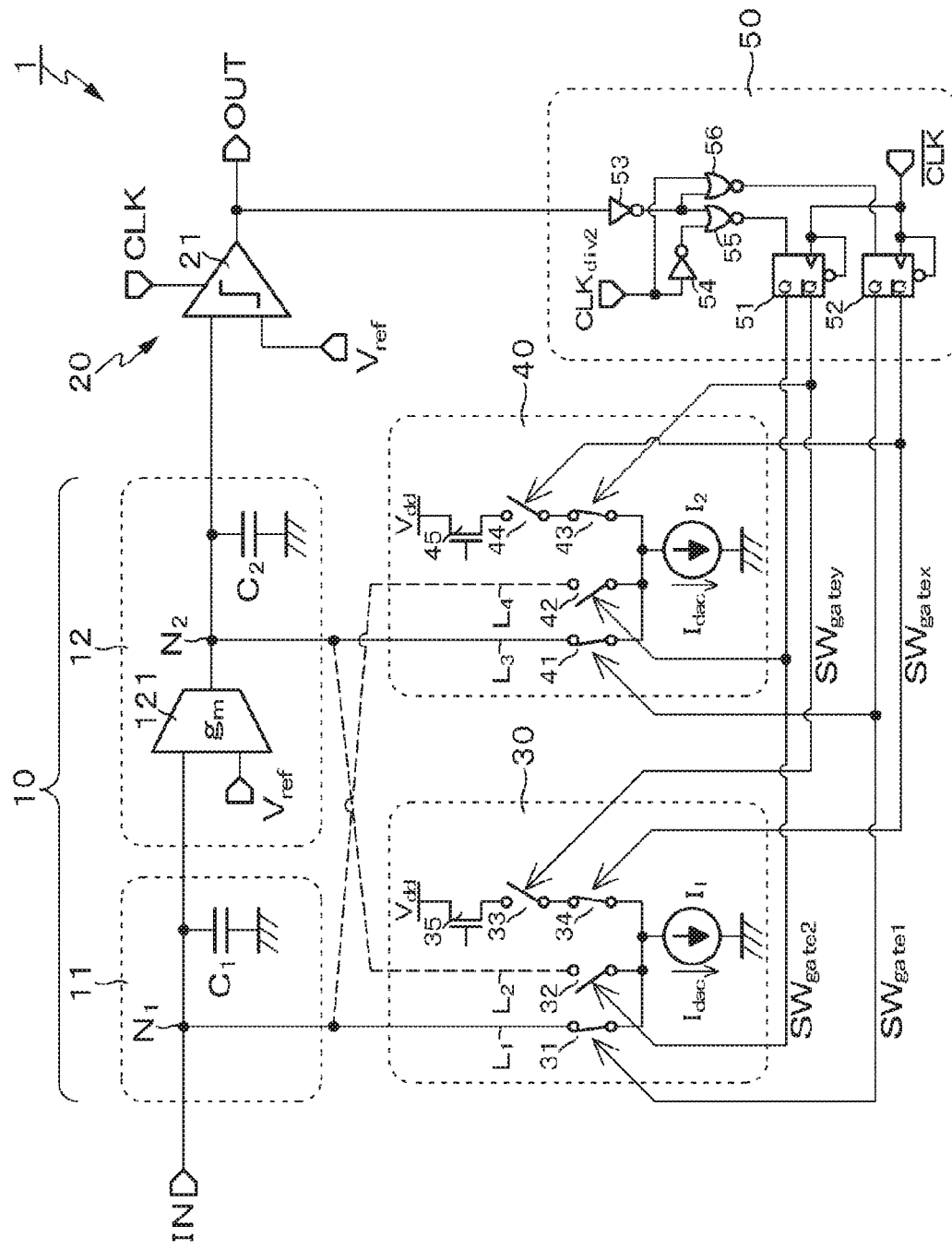
FIG. 3 is a circuit diagram illustrating a connection state of a first current-steering digital-analog converting unit and a second current-steering digital-analog converting unit to an integration circuit unit in a first connection mode.

This connection mode, that is, the connection mode in a case where the clock signal $CLK_{div2}$ is in the high level (logical "1"), is the first connection mode. A connection state of the first current-steering digital-analog converting unit 30 and the second current-steering digital-analog converting unit 40 to the integration circuit unit 10 in a case in which the connection mode is the first connection mode and in which the output of the comparator 21 is high (H) is illustrated in FIG. 3.

In a state in which the clock signal $CLK_{div2}$ is in a low (L) level, the control circuit unit 50 turns the switch element 32 of the first current-steering digital-analog converting unit 30 and the switch element 42 of the second current-steering digital-analog converting unit 40 to an on state or an off state by means of the switching control signal $SW_{gate2}$ depending on the output signal of the comparator 21. The control circuit unit 50 also turns the switch element 31 of the first current-steering digital-analog converting unit 30 and the switch element 41 of the second current-steering digital-analog converting unit 40 to an off state by means of the switching control signal $SW_{gate1}$.

This connection mode, that is, the connection mode in a case where the clock signal $CLK_{div2}$ is in the low level (logical "0"), is the second connection mode. A connection state of the first current-steering digital-analog converting unit 30 and the second current-steering digital-analog converting unit 40 to the integration circuit unit 10 in a case in which the connection mode is the second connection mode and in which the output of the comparator 21 is high (H) is illustrated in FIG. 3.

As described above, in the continuous-time delta-sigma analog-digital converter 1 according to Example 1, the connection states of the first current-steering digital-analog converting unit 30 and the second current-steering digital-analog converting unit 40 to the first-stage integrator 11 and the second-stage integrator 12 are alternately generated in synchronization with operation of the quantization circuit unit 20. Also, a feedback value supplied from the first current-steering digital-analog converting unit 30 or the second current-steering digital-analog converting unit 40 is used to derive a difference between the feedback value and a value of an analog input signal when the feedback value is input in the input terminal $N_1$ of the first-stage integrator 11.

Figure 5:
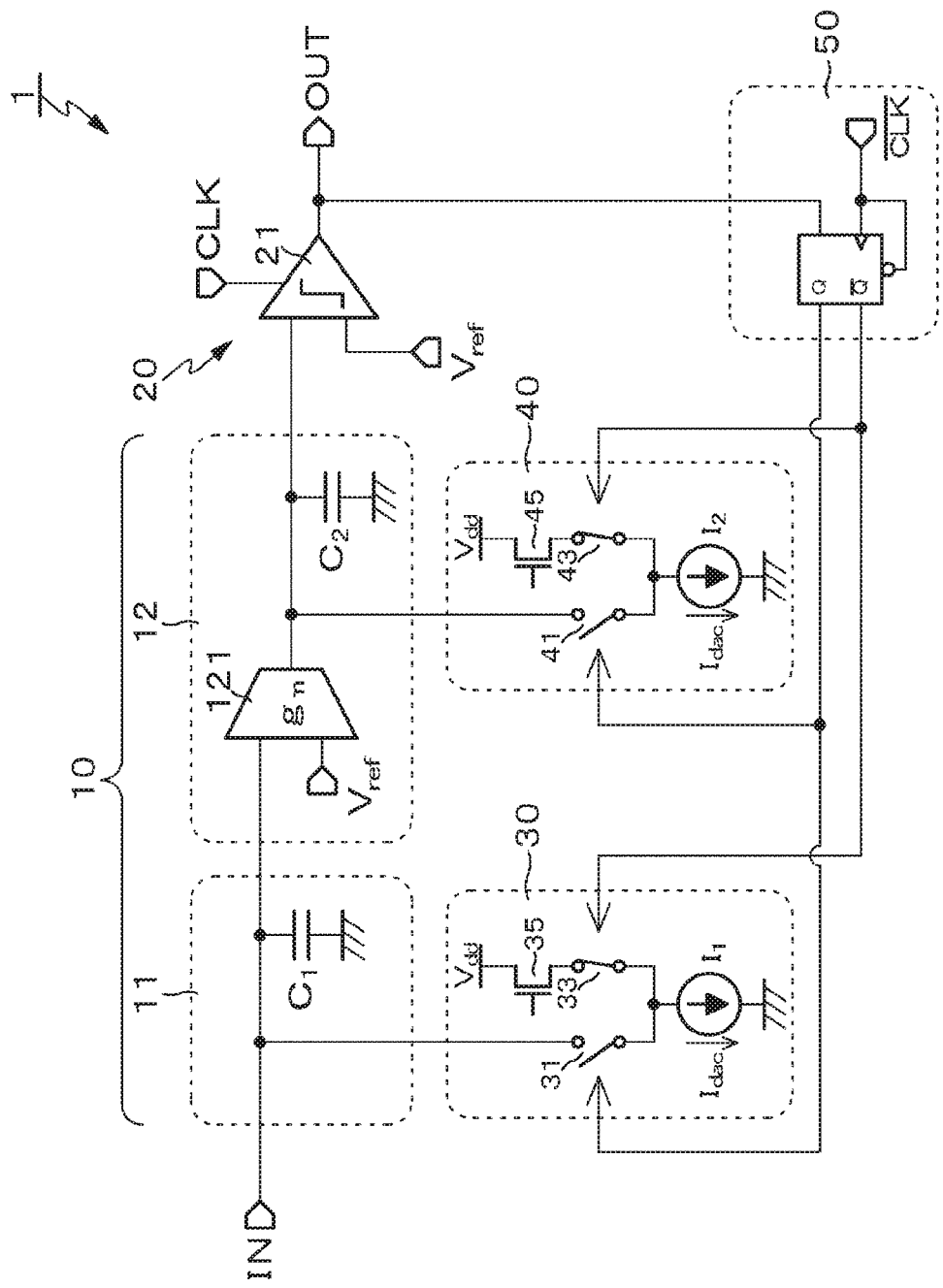
FIG. 5 is a circuit diagram illustrating an overview of a circuit configuration of a continuous-time delta-sigma analog-digital converter according to a conventional example.

Meanwhile, in a continuous-time delta-sigma analog-digital converter according to a conventional example, the connection state is fixed to a state in which the connection mode is the first connection mode. An overview of a circuit configuration of the continuous-time delta-sigma analog-digital converter according to the conventional example is illustrated in FIG. 5. As in the conventional example, in a case where the connection states of the first current-steering digital-analog converting unit 30 and the second current-steering digital-analog converting unit 40 to the first-stage integrator 11 and the second-stage integrator 12 are fixed, a low-frequency noise, especially a random telegraph noise, generated from the current source $I_1$ of the first current-steering digital-analog converting unit 30 connected to the first-stage integrator 11 is included in the output OUT as it is without being subject to a noise reduction effect exerted by delta-sigma modulation.

Meanwhile, a transistor in which a random telegraph noise is particularly high appears infrequently. Hence, in a case where the first current-steering digital-analog converting unit 30 and the second current-steering digital-analog converting unit 40 are provided, the probability that both of the random telegraph noises at the current sources $I_1$ and $I_2$ get worse becomes drastically low.

In the delta-sigma analog-digital converter, it is known that low-frequency noises generated from the digital-analog converting units inside the feedback loop, that is, the digital-analog converting units connected further inward than the second-stage integrator 12, are significantly attenuated due to delta-sigma modulation and thus do not have an influence on noise performance.

In consideration of this respect, in the delta-sigma analog-digital converter 1 according to Example 1, the first current-steering digital-analog converting unit 30 and the second current-steering digital-analog converting unit 40 are used while destinations of the feedback values output from the first current-steering digital-analog converting unit 30 and the second current-steering digital-analog converting unit 40 are switched each time of feedback.

Consequently, in a case where the random telegraph noise at the current source $I_1$ of the first current-steering digital-analog converting unit 30 connected to the first-stage integrator 11 of the delta-sigma analog-digital converter 1 is particularly high, the random telegraph noise appearing at the output OUT of the delta-sigma analog-digital converter 1 can be reduced approximately in half. More specifically, since the first current-steering digital-analog converting unit 30 is connected to the second-stage integrator 12 to cause the random telegraph noise at the current source $I_1$ to be significantly attenuated due to delta-sigma modulation, the random telegraph noise appearing at the output OUT is reduced approximately in half.

Meanwhile, in a case where the random telegraph noise at the current source $I_2$ of the second current-steering digital-analog converting unit 40 originally connected further inward than the second-stage integrator 12 is particularly high, half of the random telegraph noise will go into the first-stage integrator 11. In this case, the random telegraph noise appearing at the output OUT of the delta-sigma analog-digital converter 1 will be increased. However, this is not problematic in actual use since the appearance probability of the random telegraph noise is raised by two digits or so when the magnitude of the random telegraph noise is half.

As described above, with the delta-sigma analog-digital converter 1 according to Example 1, the random telegraph noise can be reduced without the need to increase the area of the current source transistor of the current-steering digital-analog converting unit and to design an operating point so that transconductance $g_m$ of the current source transistor may be relatively low. As a result, the yield ratio can be improved.

A general way to reduce the random telegraph noise is to increase the area of the current source transistor. In this case, the increase in size of the current source transistor of the current-steering digital-analog converting unit may be as much as to influence the size of the entire delta-sigma analog-digital converter. Conversely, with the delta-sigma analog-digital converter 1 according to Example 1, the extent of reduction of the random noise can be applied to the size reduction of the current source transistor, which can contribute to size reduction of the analog-digital converter.

Alternatively, the extent of reduction of the random noise may be applied to reduction of overdriving voltage of the current source transistor. Accordingly, since the input dynamic range of the analog-digital converter 1 and the allowable signal amplitude of the integration circuit unit 10 can be enlarged as much as the extent, this causes merits such as improvement of an SN ratio, improvement of linearity of an output signal to an input signal, and easiness of low power supply voltage design.

Figure 4:
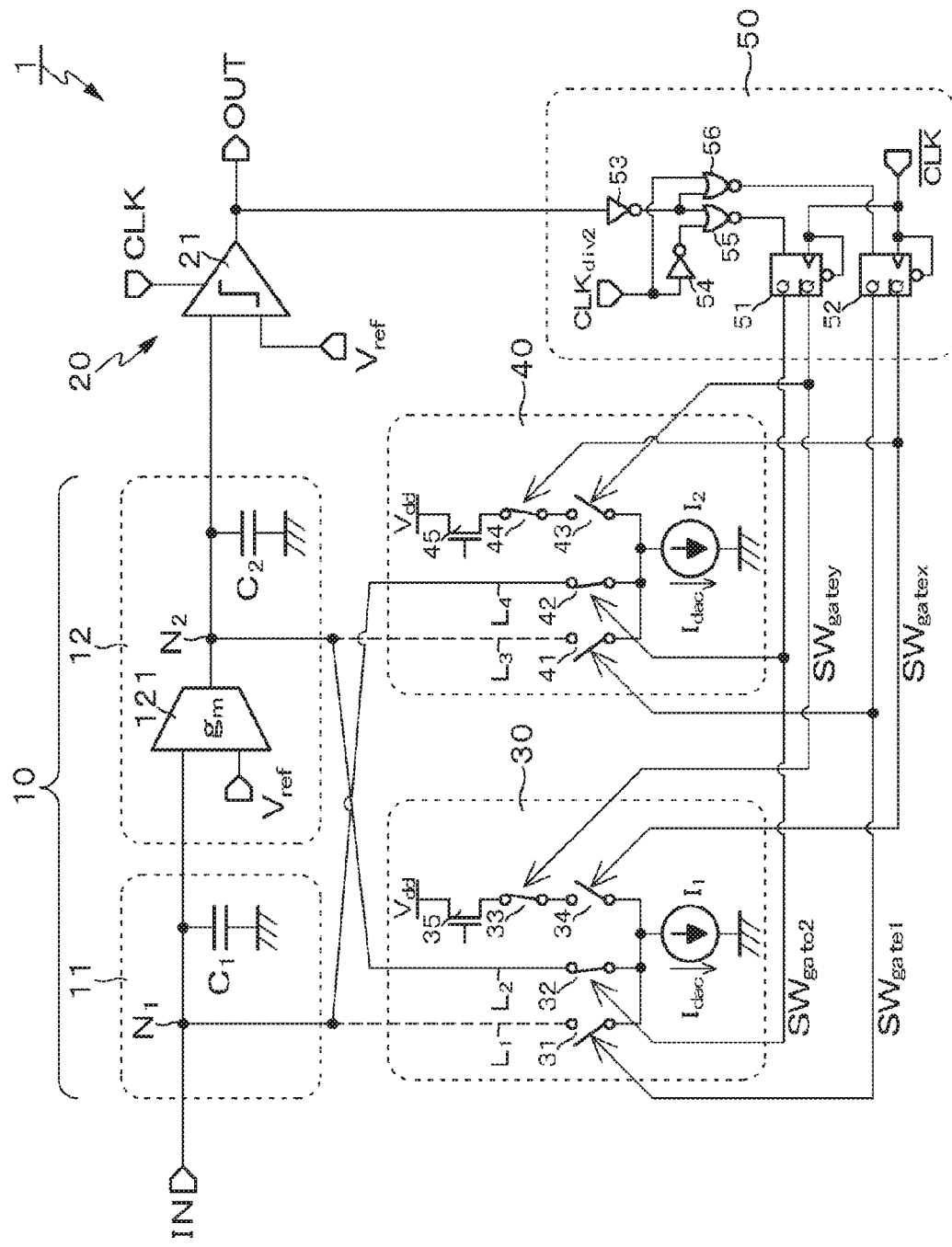
FIG. 4 is a circuit diagram illustrating a connection state of the first current-steering digital-analog converting unit and the second current-steering digital-analog converting unit to the integration circuit unit in a second connection mode.

Meanwhile, in Example 1, although destinations of the feedback values output from the first current-steering digital-analog converting unit 30 and the second current-steering digital-analog converting unit 40 are switched each time of feedback, the present disclosure is not limited to this control mode. That is, the connection state of the output destinations of the feedback values is fixed to either of the connection states to check in advance which connection state causes less random telegraph noise. The connection state is then fixed to one that causes less random telegraph noise. Consequently, the random telegraph noise can be further reduced in actual use. This fixed connection state can be achieved by fixing the clock signal $CLK_{div2}$ to a high level or a low level and fixing the connection state to the connection state in FIG. 3 or the connection state in FIG. 4, whichever causes less random telegraph noise.

Example 2

Example 2 is a modification example of Example 1. In Example 2, the circuit configuration of the control circuit unit 50 differs from that in Example 1. A circuit configuration of the continuous-time delta-sigma analog-digital converter according to Example 2 is illustrated in FIG. 6, and a timing waveform chart of signals at respective parts of the continuous-time delta-sigma analog-digital converter according to Example 2 is illustrated in FIG. 7.

Figure 6:
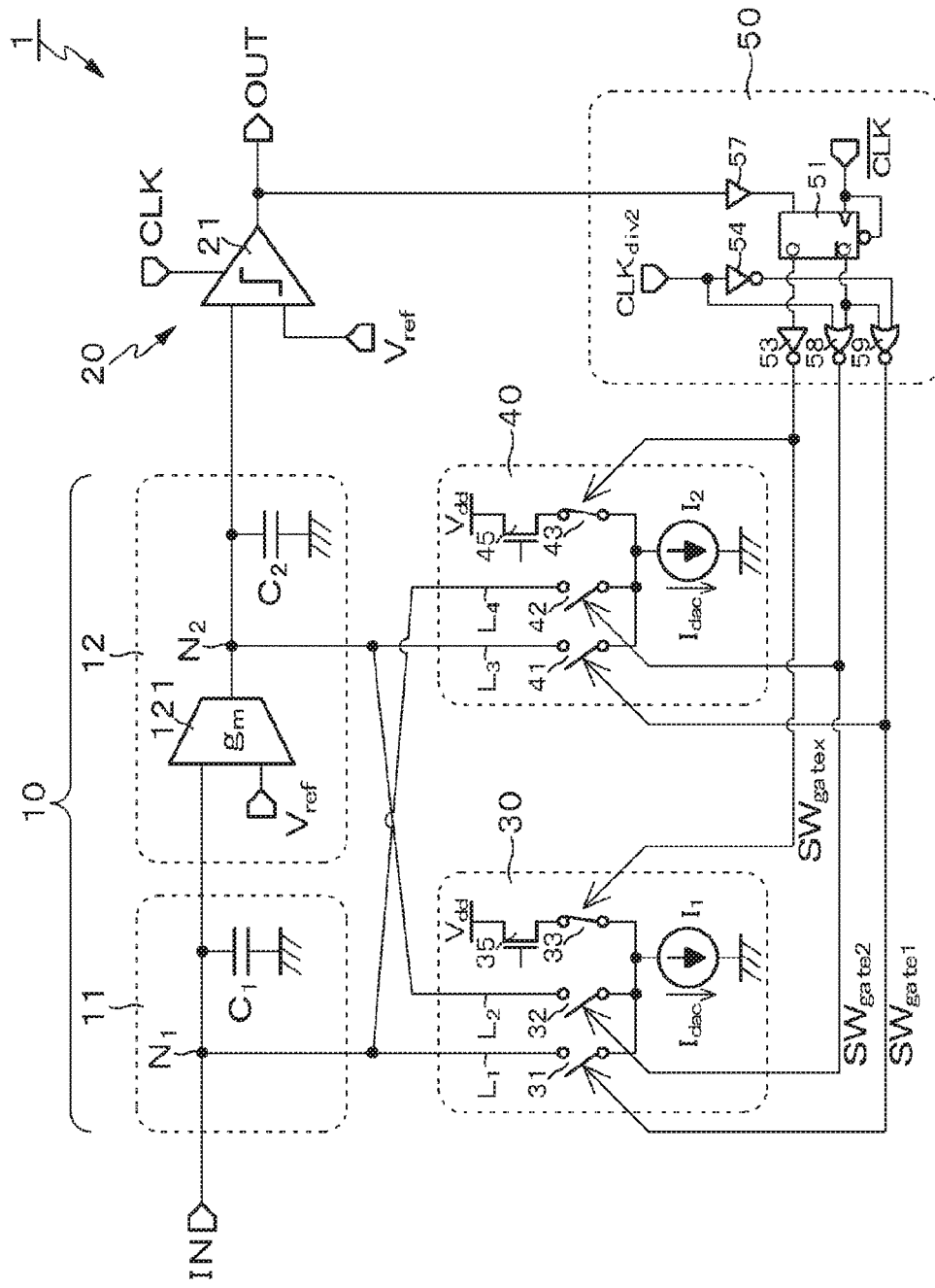
FIG. 6 is a circuit diagram illustrating an overview of a circuit configuration of a continuous-time delta-sigma analog-digital converter according to Example 2.
Figure 7:
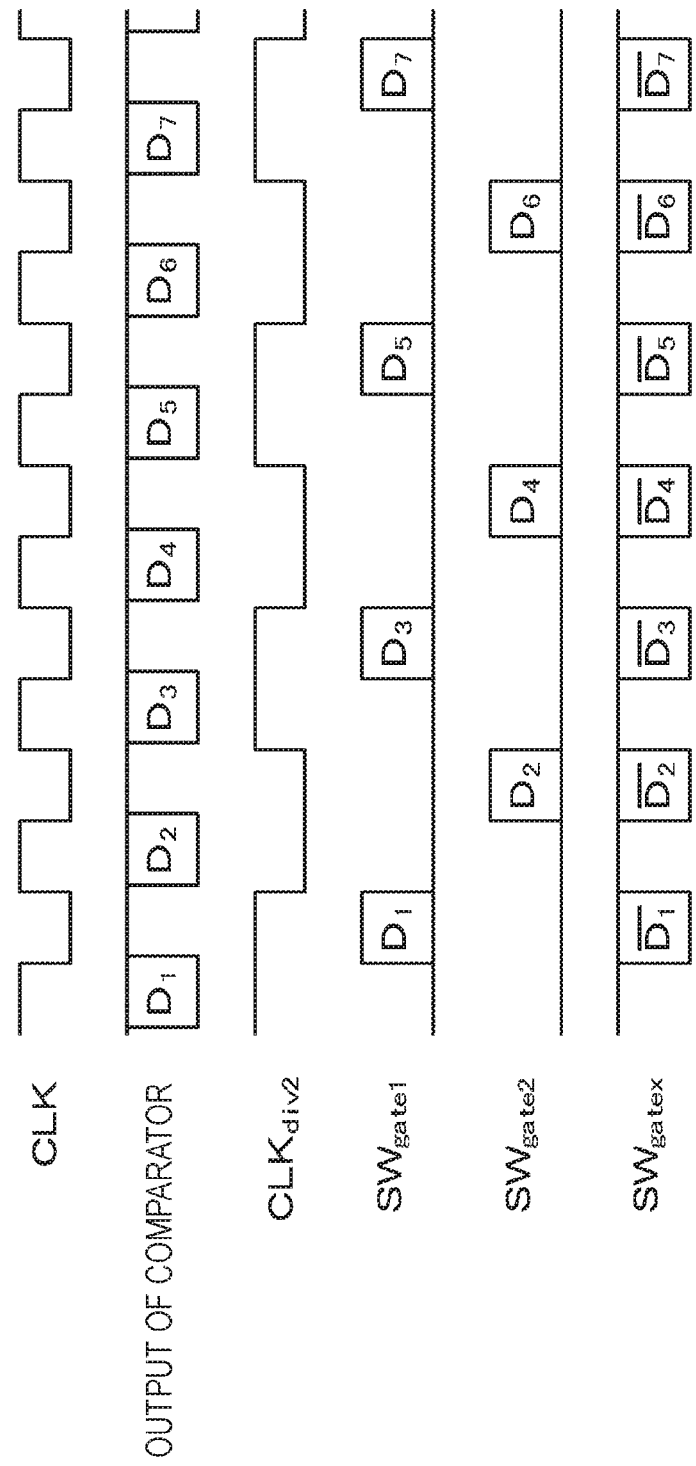
FIG. 7 is a timing waveform chart of signals at respective parts of the continuous-time delta-sigma analog-digital converter according to Example 2.

As illustrated in FIG. 6, the control circuit unit 50 includes one D flip-flop 51, two inverter circuits 53 and 54, one buffer circuit 57, and two NOR circuits 58 and 59. The flip-flop 51 receives as a D input an output signal of the comparator 21 transmitted via the buffer circuit 57 and receives as a clock input a reversed-phase clock signal of the clock signal CLK, which is a reference of operation of the comparator 21. The inverter circuit 53 inverts the polarity of a Q output of the flip-flop 51 and uses the polarity-inverted Q signal as a switching control signal $SW_{gatex}$ for the switch element 33 of the first current-steering digital-analog converting unit 30 and the switch element 43 of the second current-steering digital-analog converting unit 40.

The NOR circuit 58 receives as two inputs a clock signal $CLK_{div2}$ obtained by dividing the frequency of the clock signal CLK by ½ and an inversion output of the Q output of the flip-flop 51 and uses an output thereof as a switching control signal $SW_{gate2}$ for the switch element 32 of the first current-steering digital-analog converting unit 30 and the switch element 42 of the second current-steering digital-analog converting unit 40. The NOR circuit 59 receives as two inputs the inversion output of the Q output of the flip-flop 51 and the clock signal $CLK_{div2}$ passing through the inverter circuit 54 and uses an output thereof as a switching control signal $SW_{gate1}$ for the switch element 31 of the first current-steering digital-analog converting unit 30 and the switch element 41 of the second current-steering digital-analog converting unit 40.

In the delta-sigma analog-digital converter 1 according to Example 2, which includes the control circuit unit 50 having the above circuit configuration, the first current-steering digital-analog converting unit 30 and the second current-steering digital-analog converting unit 40 are used while destinations of the feedback values output from the first current-steering digital-analog converting unit 30 and the second current-steering digital-analog converting unit 40 are switched each time of feedback. Accordingly, in a similar manner to the case of Example 1, the random telegraph noise can be reduced without the need to increase the area of the current source transistor and to design the operating point so that transconductance $g_m$ of the current source transistor may be relatively low.

Note that, in each of the first current-steering digital-analog converting unit 30 and the second current-steering digital-analog converting unit 40, although the number of the switch elements on the load side is two in Example 1 but is one in Example 2, there is no difference in the circuit operation.

Example 3

Example 3 is a modification example of Example 2. In Example 3, the type of the first-stage integrator 11 differs from that in Example 2. A circuit configuration of a continuous-time delta-sigma analog-digital converter according to Example 3 is illustrated in FIG. 8.

Figure 8:
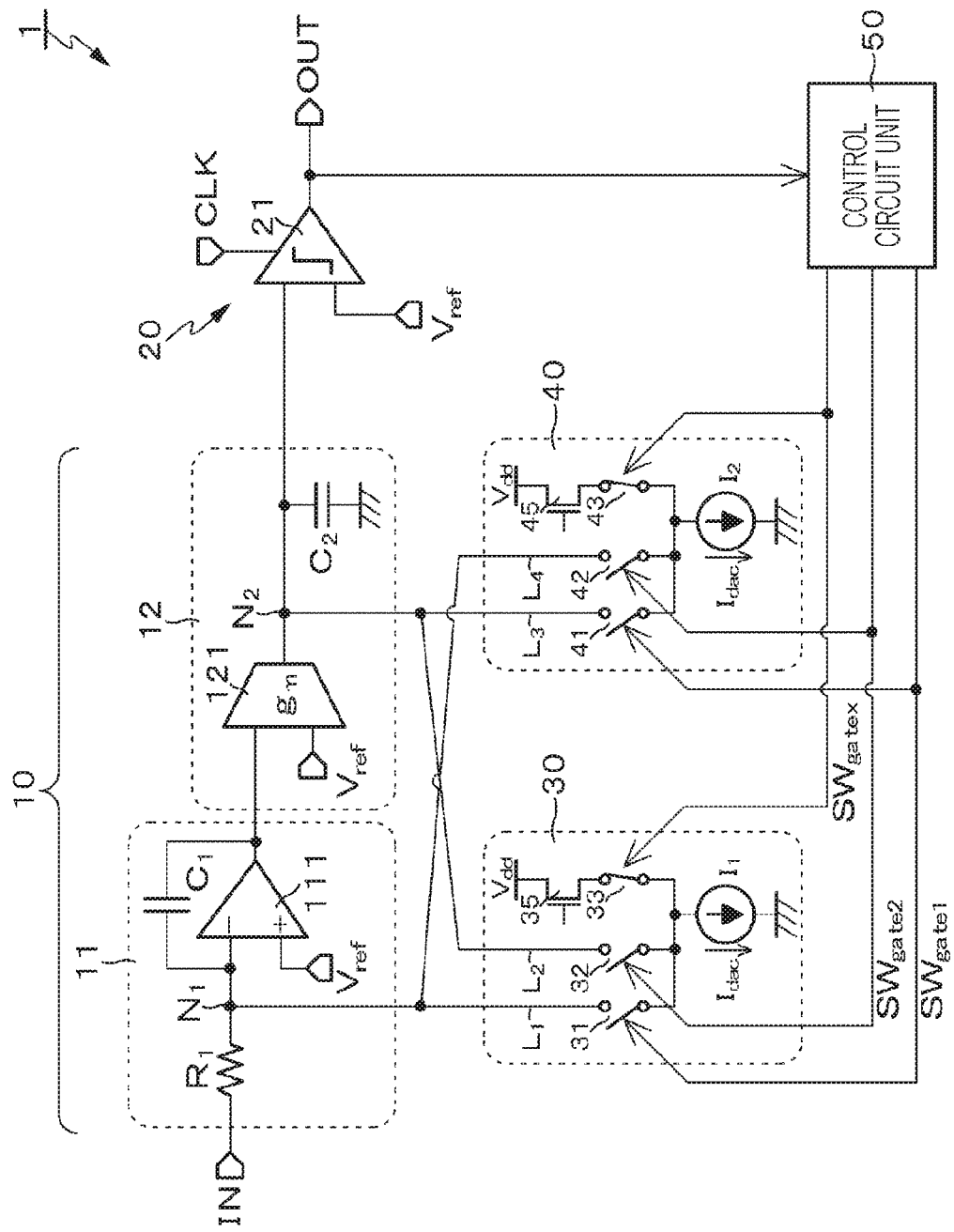
FIG. 8 is a circuit diagram illustrating an overview of a circuit configuration of a continuous-time delta-sigma analog-digital converter according to Example 3.

As illustrated in FIG. 8, the first-stage integrator 11 has a circuit configuration in which an operation amplifier 111 is used. An inversion (−) input terminal of the operation amplifier 111 is provided with an analog signal via a resistive element $R_1$, and a non-inversion (+) input terminal thereof is provided with reference voltage $V_{ref}$. Furthermore, between the inversion input terminal of the operation amplifier 111 and an output terminal, the capacitive element $C_1$ is connected.

In the first-stage integrator 11 having the above circuit configuration, a feedback value supplied from the first current-steering digital-analog converting unit 30 or the second current-steering digital-analog converting unit 40 is used to derive a difference between the feedback value and a value of an analog input signal when the feedback value is input in the inversion input terminal of the operation amplifier 111. By using the operation amplifier 111, an integral waveform can be obtained in a more stable manner.

The configuration other than the first-stage integrator 11 is equal to that of the delta-sigma analog-digital converter 1 according to Example 2 illustrated in FIG. 6. Accordingly, in the continuous-time delta-sigma analog-digital converter 1 according to Example 3 as well as in the cases of Example 1 and Example 2, the random telegraph noise can be reduced without the need to increase the area of the current source transistor and to design the operating point so that transconductance $g_m$ of the current source transistor may be relatively low.

Example 4

Figure 9:
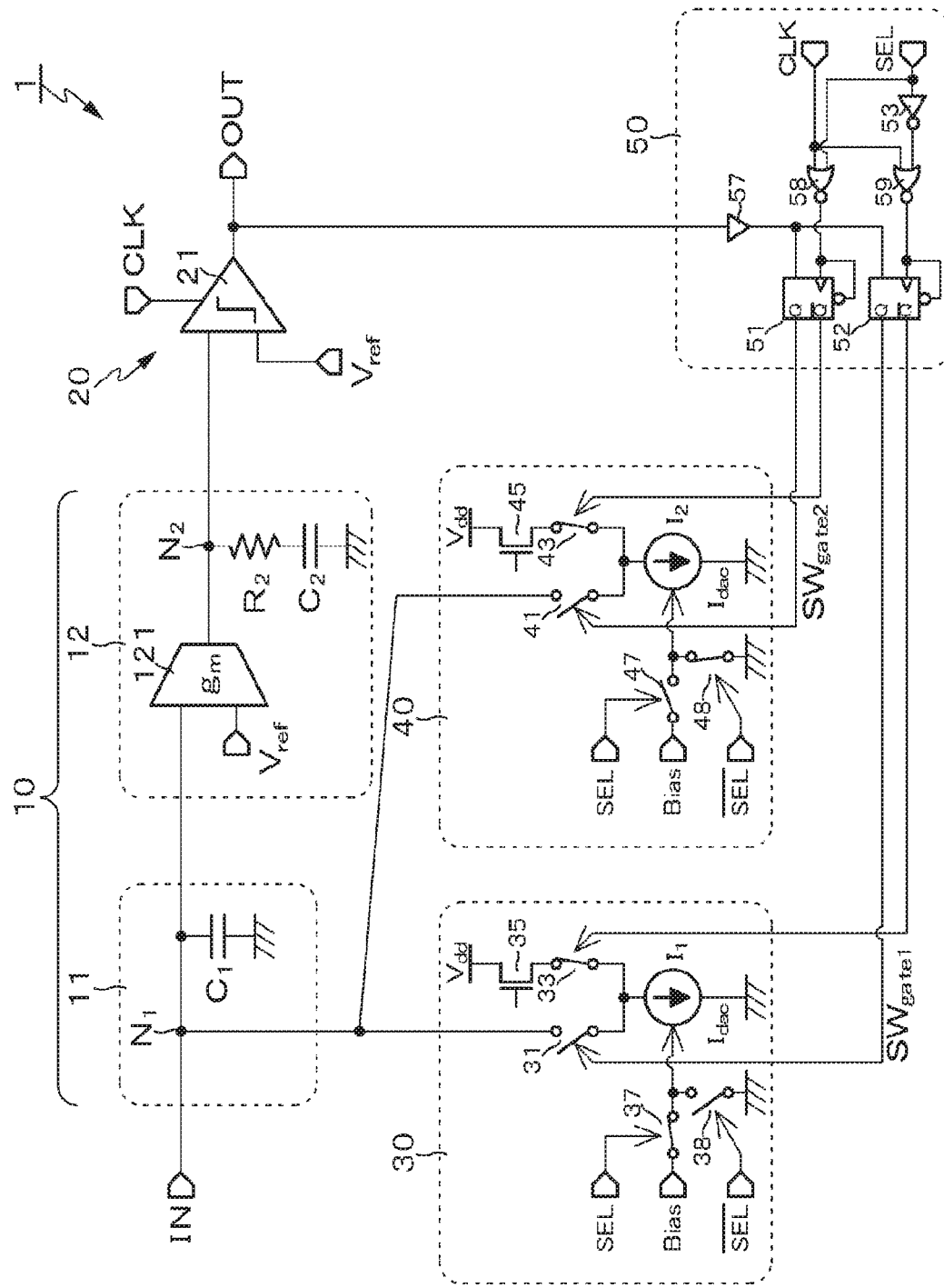
FIG. 9 is a circuit diagram illustrating an overview of a circuit configuration of a continuous-time delta-sigma analog-digital converter according to Example 4.

Example 4 is an example in which, in the second-order delta-sigma analog-digital converter 1 including a current-steering digital-analog converting unit only for the first-stage integrator 11, a second current-steering digital-analog converting unit 40 is provided as a backup of a first current-steering digital-analog converting unit 30. A circuit configuration of a continuous-time delta-sigma analog-digital converter according to Example 4 is illustrated in FIG. 9.

The delta-sigma analog-digital converter 1 according to Example 4 is an analog-digital converter which is in a type of including only one current-steering digital-analog converting unit (first current-steering digital-analog converting unit 30) in a feedback loop. In this case, since there is no current-steering digital-analog converting unit that gives a feedback value to the second-stage integrator 12, the second-stage integrator 12 has a circuit configuration in which a resistive element $R_2$ and the capacitive element $C_2$ are connected in series between the input terminal $N_2$ and a reference potential point (for example, a GND).

The delta-sigma analog-digital converter 1 according to Example 4 does not use the second current-steering digital-analog converting unit 40 as a digital-analog converting unit giving a feedback value to the second-stage integrator 12 but includes the second current-steering digital-analog converting unit 40 as a backup of the first current-steering digital-analog converting unit 30. Also, an output terminal of the first current-steering digital-analog converting unit 30 or the second current-steering digital-analog converting unit 40, whichever generates the lower random telegraph noise, is connected to the input terminal $N_1$ of the first-stage integrator 11 in a fixed manner.

The first current-steering digital-analog converting unit 30 includes a switch element 37 selectively giving bias voltage Bias to the current source $I_1$ and a switch element 38 selectively grounding an input terminal of the current source $I_1$ for the bias voltage Bias. The second current-steering digital-analog converting unit 40 also includes switch elements 47 and 48 functioning similarly.

Also, the switch element 37 or 47 of the first current-steering digital-analog converting unit 30 or the second current-steering digital-analog converting unit 40, whichever generates the lower random telegraph noise, is in an on (closed) state. As a result, the bias voltage Bias is supplied, and the current source $I_1$ or $I_2$ is activated.

In the delta-sigma analog-digital converter 1 according to Example 4, in the first current-steering digital-analog converting unit 30 or the second current-steering digital-analog converting unit 40, whichever is not used, the switch element 38 or 48 is in an on (closed) state to ground the input terminal of the current source $I_1$ or $I_2$ for the bias voltage Bias (lower the level). As a result, the current source $I_1$ or $I_2$ of the first current-steering digital-analog converting unit 30 or the second current-steering digital-analog converting unit 40, whichever is not used, is inactivated, which prevents bias current from flowing in the current source $I_1$ or $I_2$ in vein.

Although the number of the second current-steering digital-analog converting units 40 to be prepared is one in this example, the number is not limited to one but may be plural. In this case, an output terminal of the digital-analog converting unit generating the lowest random telegraph noise among the first current-steering digital-analog converting unit 30 and the plurality of second current-steering digital-analog converting units 40 is connected to the input terminal $N_1$ of the first-stage integrator 11 in a fixed manner.

With the delta-sigma analog-digital converter 1 according to Example 4 configured as above, by connecting the digital-analog converting unit generating the lowest random telegraph noise to the input terminal $N_1$ of the first-stage integrator 11 in a fixed manner, the random telegraph noise can be reduced further than in a case of connecting the digital-analog converting unit generating the higher random telegraph noise. Note that, in the delta-sigma analog-digital converter 1 which is in a type of including only one current-steering digital-analog converting unit in the feedback loop, since the second current-steering digital-analog converting unit 40 is provided as a backup, the area is larger than in a case of providing no backup. However, the area of the delta-sigma analog-digital converter 1 can be smaller than in a case of providing an entire delta-sigma analog-digital converter as a backup.

Example 5

Figure 10:
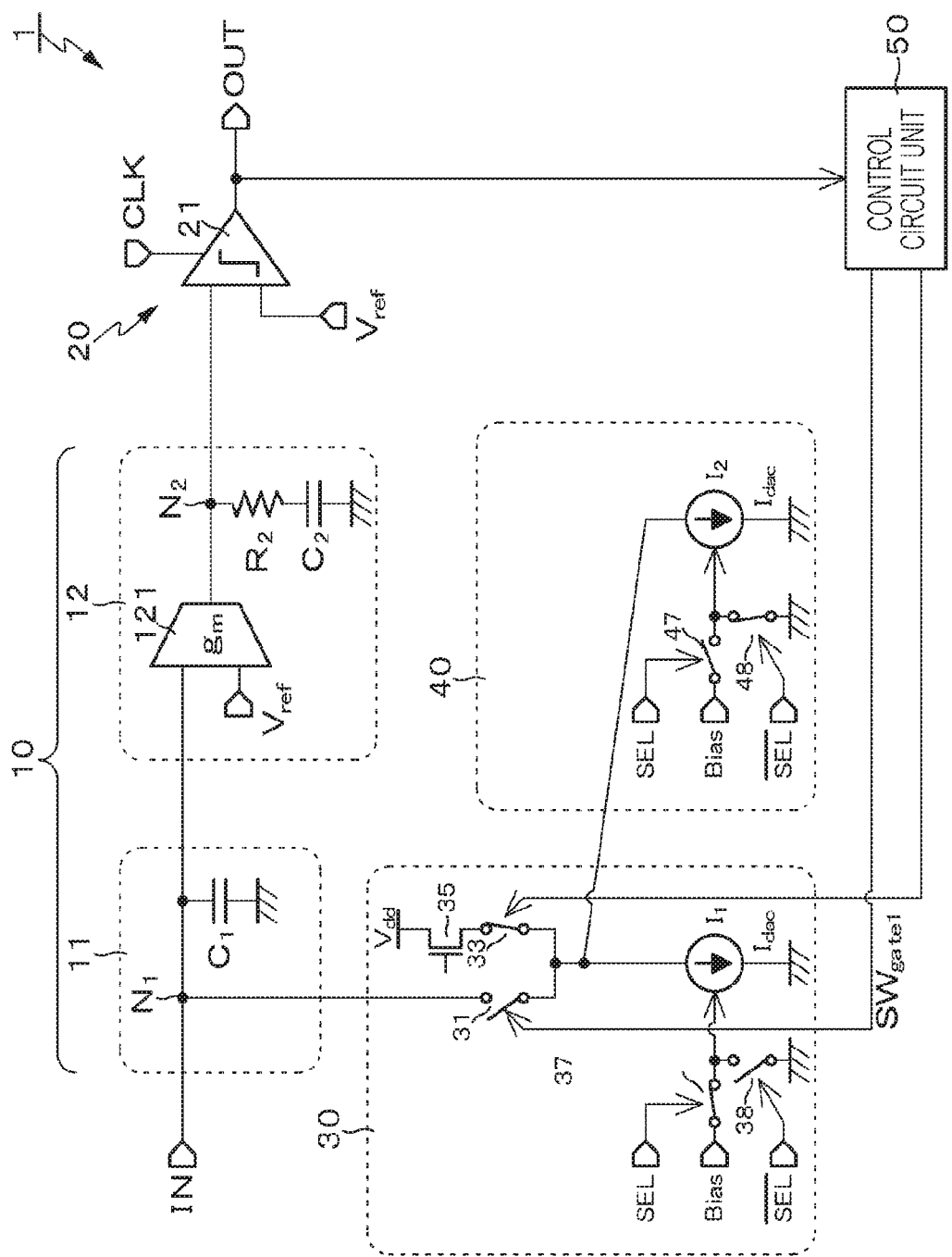
FIG. 10 is a circuit diagram illustrating an overview of a circuit configuration of a continuous-time delta-sigma analog-digital converter according to Example 5.

Example 5 is a modification example of Example 4. A circuit configuration of a continuous-time delta-sigma analog-digital converter according to Example 5 is illustrated in FIG. 10. The delta-sigma analog-digital converter 1 according to Example 5 has a circuit configuration in which the second current-steering digital-analog converting unit 40 provided as a backup includes the current source $I_2$ and the switch elements 47 and 48, not including a switch circuit part (switch elements 41 and 43 and the like).

In other words, the delta-sigma analog-digital converter 1 according to Example 5 has a configuration in which the switch circuit part of the first current-steering digital-analog converting unit 30 is used in common by the first current-steering digital-analog converting unit 30 and the second current-steering digital-analog converting unit 40.

In the delta-sigma analog-digital converter 1 according to Example 5 configured as above, similar effects can be obtained to those in the case of Example 4. Furthermore, using the switch circuit part of the first current-steering digital-analog converting unit 30 in common by the first current-steering digital-analog converting unit 30 and the second current-steering digital-analog converting unit 40 brings about a merit of decreasing the area further than in the case of Example 4.

Example 6

Figure 11:
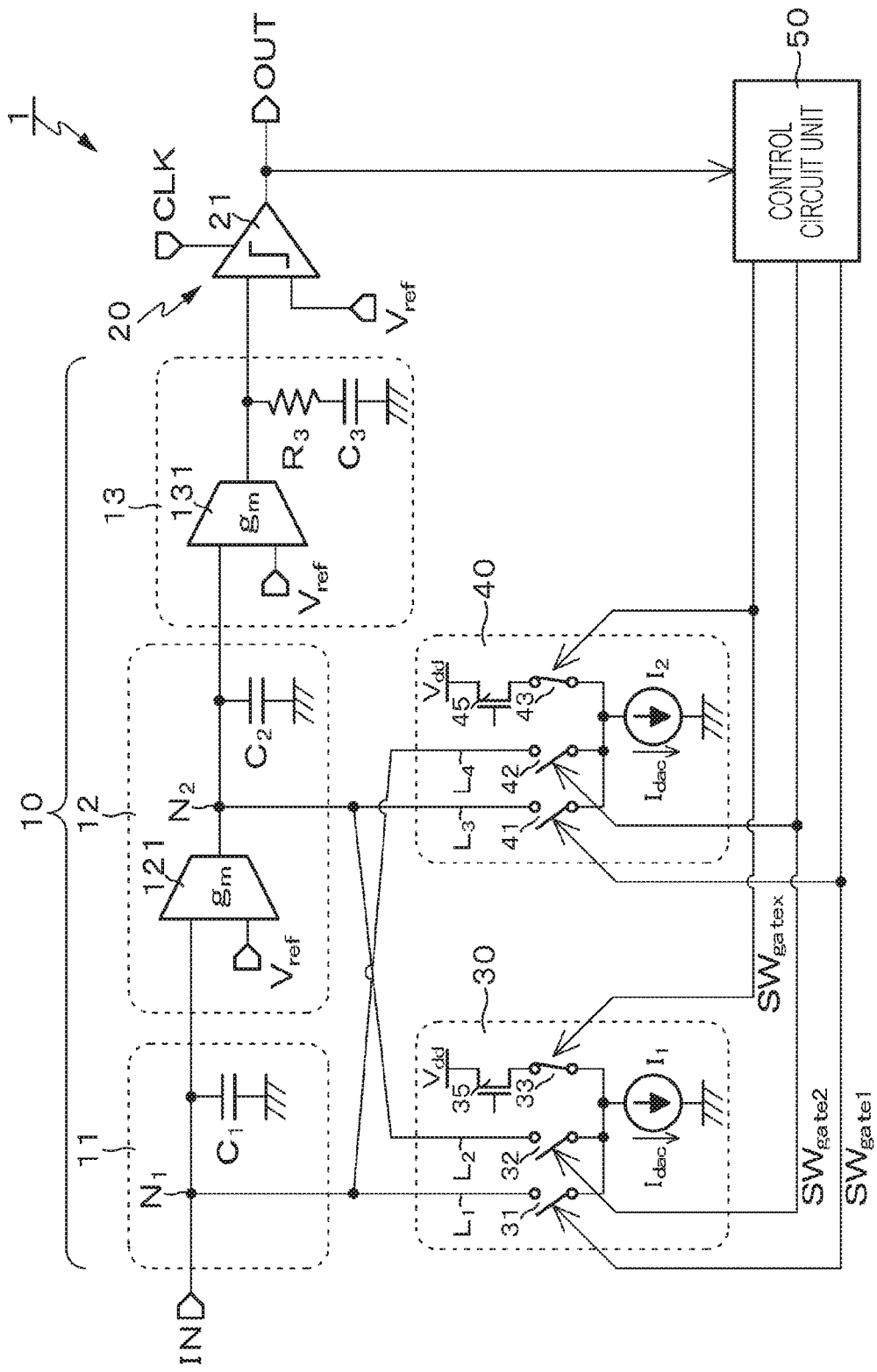
FIG. 11 is a circuit diagram illustrating an overview of a circuit configuration of a continuous-time delta-sigma analog-digital converter according to Example 6.

Example 6 is an example of a third-order delta-sigma analog-digital converter. An overview of a circuit configuration of a continuous-time delta-sigma analog-digital converter according to Example 6 is illustrated in FIG. 11.

The delta-sigma analog-digital converter 1 according to Example 6 has a circuit configuration in which the first-stage integrator 11 and the second-stage integrator 12 are equal to those in the case of Example 1. However, the circuit configuration is not limited to this circuit configuration but may be a circuit configuration in which the first-stage integrator 11 uses the operation amplifier 111 as in Example 3, for example. A third-stage integrator 13 includes a $g_m$ amplifier 131 and includes a resistive element $R_3$ and a capacitive element $C_3$ connected in series between an output terminal of the $g_m$ amplifier 131 and a reference potential point (for example, the GND).

The other configurations than the integration circuit unit 10, that is, the configurations of the quantization circuit unit 20, the first current-steering digital-analog converting unit 30, the second current-steering digital-analog converting unit 40, and the control circuit unit 50 are basically equal to those in the case of Example 1 or Example 2. Accordingly, in the delta-sigma analog-digital converter 1 according to Example 6 as well as in the case of Example 1, the random telegraph noise can be reduced without the need to increase the area of the current source transistor and to design the operating point so that transconductance $g_m$ of the current source transistor may be relatively low.

Note that the techniques in Example 4 and Example 5 can be applied to the delta-sigma analog-digital converter 1 according to Example 6.

Modification Example

Although the cases where the digital-analog converting unit provided in the delta-sigma analog-digital converter in a similar manner to the first current-steering digital-analog converting unit 30 is used as the second current-steering digital-analog converting unit 40 have been described above as examples, the present disclosure is not limited to this. That is, a digital-analog converting unit provided in a delta-sigma analog-digital converter adjacent to the delta-sigma analog-digital converter provided with the first current-steering digital-analog converting unit 30 may be used as the second current-steering digital-analog converting unit 40. A specific example thereof will be described below in detail as Example 7.

Each of the continuous-time delta-sigma analog-digital converters 1 according to Example 1 to Example 6 can be used as an analog-digital converter converting an analog pixel signal output from a unit pixel into a digital signal in a solid-state image sensing device such as a CMOS image sensor. However, each of the continuous-time delta-sigma analog-digital converters 1 according to Example 1 to Example 6 can not only be applied to the solid-state image sensing device but to devices in various fields such as a signal processing system of a reception unit in a communication device and an audio system. Hereinbelow, a case where each of the continuous-time delta-sigma analog-digital converters 1 according to Example 1 to Example 6 is applied to the solid-state image sensing device will be described as an example.

<Solid-State Image Sensing Device According to Present Disclosure>
[Basic System Configuration]

Figure 12:
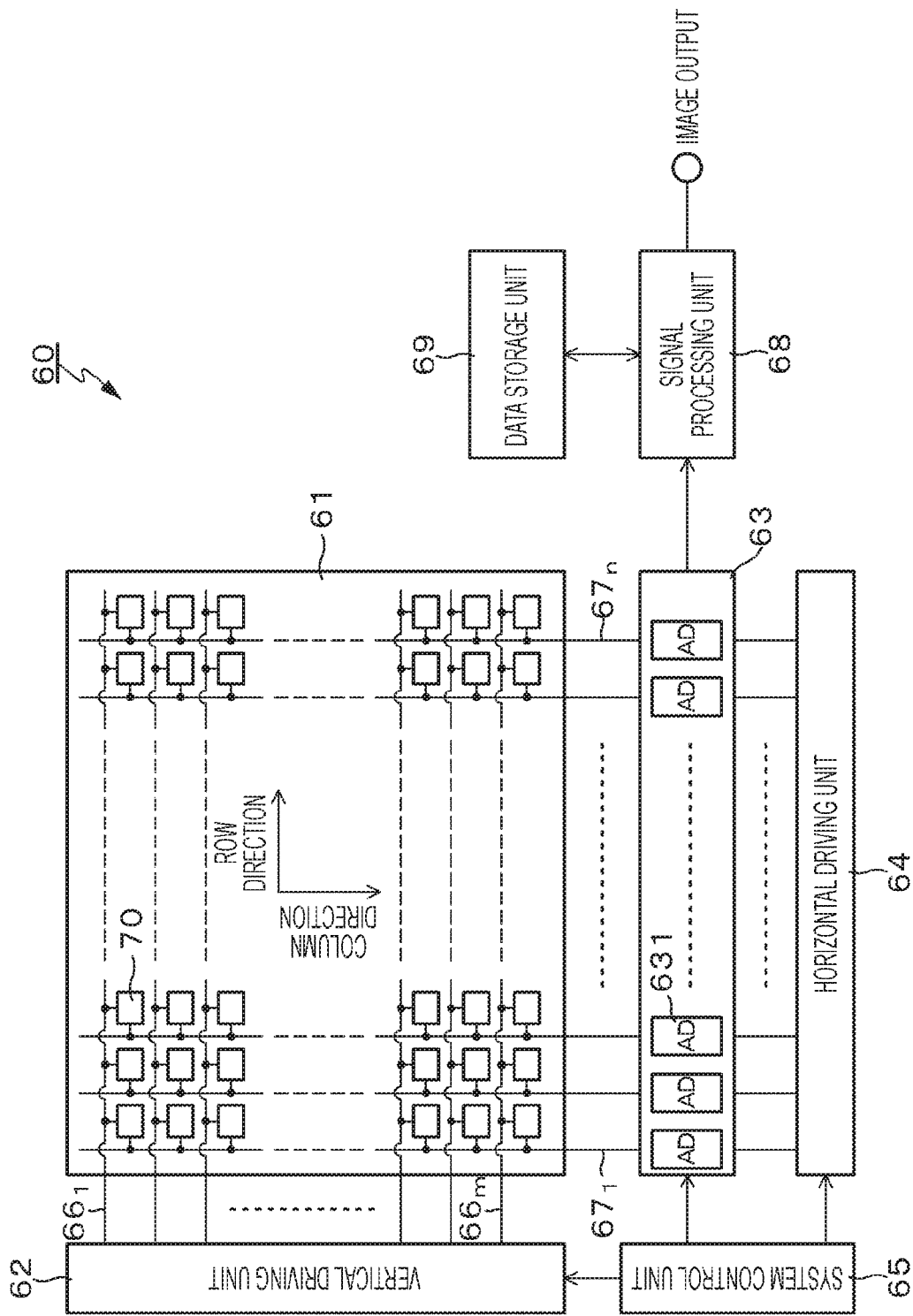
FIG. 12 is a schematic configuration diagram illustrating a basic system configuration of a CMOS image sensor as an example of a solid-state image sensing device according to the present disclosure.

FIG. 12 is a schematic configuration diagram illustrating a basic system configuration of a solid-state image sensing device according to the present disclosure. Here, a solid-state image sensing device will be described by raising as an example a CMOS image sensor serving as a kind of an X-Y address system solid-state image sensing device. The CMOS image sensor is an image sensor produced by applying a CMOS process or partially using the CMOS process.

A CMOS image sensor 60 in this example has a configuration in which a pixel array unit 61 formed on a not-illustrated semiconductor substrate (chip) and a peripheral circuit unit integrated on the same semiconductor substrate as that for the pixel array unit 61 are provided. The peripheral circuit unit includes a vertical driving unit 62, a column processing unit 63, a horizontal driving unit 64, and a system control unit 65, for example.

The CMOS image sensor 60 further includes a signal processing unit 68 and a data storage unit 69. The signal processing unit 68 and the data storage unit 69 may be mounted on the same substrate as that for the CMOS image sensor 60 or may be arranged on a different substrate from that for the CMOS image sensor 60. Furthermore, processing of the signal processing unit 68 and the data storage unit 69 may be performed by an external signal processing unit, such as a digital signal processor (DSP) circuit and software, provided on a different substrate from that for the CMOS image sensor 60.

The pixel array unit 61 has a configuration in which unit pixels (hereinbelow referred to simply as "pixels" in some cases) 70 each including a photoelectric conversion unit performing photoelectric conversion to generate and store photoelectric charge in accordance with the amount of received light are two-dimensionally arranged in row and column directions or in a matrix form. Here, the row direction refers to an arranging direction of pixels on a pixel row (that is, a horizontal direction), and the column direction refers to an arranging direction of pixels on a pixel column (that is, a vertical direction).

In the pixel array unit 61, pixel driving lines 66 ($66_1$ to $66_m$) are arranged along the row direction on the respective pixel rows while vertical signal lines 67 ($67_1$ to $67_n$) are arranged along the column direction on the respective pixel columns with respect to the matrix-formed pixel arrangement. The pixel driving line 66 transmits a below-mentioned driving signal for performing driving at the time of reading a signal from a pixel. In FIG. 12, although the pixel driving line 66 includes one line, the number of the lines is not limited to one. One end of the pixel driving line 66 is connected to an output end of the vertical driving unit 62 corresponding to each row.

The vertical driving unit 62 includes a shift register, an address decoder, and the like and drives the respective pixels 70 in the pixel array unit 61 entirely at the same time, per row, or the like. In other words, the vertical driving unit 62 functions as a driving unit driving the respective pixels 70 in the pixel array unit 61 together with the system control unit 65 controlling the vertical driving unit 62. Although illustration of a specific configuration of the vertical driving unit 62 is omitted, the vertical driving unit 62 generally includes two scanning systems including a read-out scanning system and a sweep-out scanning system.

The read-out scanning system selectively scans the unit pixels 70 in the pixel array unit 61 sequentially per row to read out signals from the unit pixels 70. A signal read out from the unit pixel 70 is an analog signal. The sweep-out scanning system performs sweep-out scanning for a read-out row to be subject to read-out scanning by the read-out scanning system earlier by time of shutter speed than the read-out scanning.

As a result of this sweep-out scanning by the sweep-out scanning system, unnecessary charge is swept out from the photoelectric conversion unit of the unit pixel 70 on the read-out row to cause the photoelectric conversion unit to be reset. Also, as a result of sweeping out (resetting) unnecessary charge by means of the sweep-out scanning system, a so-called electronic shutter operation is performed. Here, the electronic shutter operation refers to an operation of throwing away photoelectric charge of the photoelectric conversion unit and newly starting exposure (starting storing photoelectric charge).

A signal read out by a read-out operation by the read-out scanning system corresponds to the amount of light received after a preceding read-out operation or electronic shutter operation. Also, a period from read-out timing of the preceding read-out operation or sweep-out timing of the preceding electronic shutter operation to read-out timing of the present read-out operation is an exposure period of photoelectric charge in the unit pixel 70.

Signals output from the respective pixels 70 on the pixel row selectively scanned by the vertical driving unit 62 are input via the respective vertical signal lines 67 on the respective pixel columns into the column processing unit 63.

The column processing unit 63 includes analog-digital converters (AD converters) 631 each converting an analog pixel signal output via the vertical signal line 67 from each pixel 70 on the selected row into a digital signal per pixel column or group of a plurality of pixel columns of the pixel array unit 61. The column processing unit 63 can be configured to perform not only the AD conversion processing but also other signal processing such as noise removal processing. Examples of the noise removal processing can be correlated double sampling (CDS) processing and double data sampling (DDS) processing, for example. For example, by means of the CDS processing, a reset noise and a fixed pattern noise unique to a pixel such as threshold value variation of an amplifier transistor in the pixel 70 can be removed.

The horizontal driving unit 64 includes a shift register, an address decoder, and the like and selectively scans a unit circuit of the column processing unit 63 corresponding to each pixel column or a plurality of pixel columns sequentially. As a result of the selective scanning by the horizontal driving unit 64, a pixel signal subject to signal processing such as AD conversion per unit circuit in the column processing unit 63 is output sequentially.

The system control unit 65 includes a timing generator or the like generating various timing signals and performs driving control for the vertical driving unit 62, the column processing unit 63, the horizontal driving unit 64, and the like on the basis of the various timing signals generated in the timing generator.

The signal processing unit 68 at least has an operation processing function and performs various kinds of signal processing such as operation processing to a pixel signal output from the column processing unit 63. The data storage unit 69 temporarily stores data required for signal processing in the signal processing unit 68 at the time of the processing.

In the CMOS image sensor 60 configured as above, as the analog-digital converter 631 provided in the column processing unit 63 per pixel column or group of a plurality of pixel columns of the pixel array unit 61, the aforementioned delta-sigma analog-digital converter 1 according to any one of Example 1 to Example 6 can be used. In the delta-sigma analog-digital converter 1 according to any one of Example 1 to Example 6, the random telegraph noise can be reduced without the need to increase the area of the current source transistor of the current-steering digital-analog converting unit and to design an operating point so that transconductance $g_m$ of the current source transistor may be relatively low.

In the CMOS image sensor 60, the random telegraph noise is generated as a vertical-striped random noise and causes degradation of image quality. Conversely, by using the delta-sigma analog-digital converter 1 according to any one of Example 1 to Example 6 as the analog-digital converter 631 of the column processing unit 63, the random telegraph noise generated in the analog-digital converter 631 can be reduced, and image quality can thus be improved.

Furthermore, since the extent of reduction of the random noise can be applied to the size reduction of the current source transistor, the size of the analog-digital converter 631 can be reduced. This can contribute to size reduction of the column processing unit 63 and reduction in chip size of the CMOS image sensor 60.

Meanwhile, as described above, a digital-analog converting unit provided in a delta-sigma analog-digital converter adjacent to the delta-sigma analog-digital converter provided with the first current-steering digital-analog converting unit 30 can be used as the second current-steering digital-analog converting unit 40. A specific example thereof will be described below as Example 7.

Example 7

Figure 13:
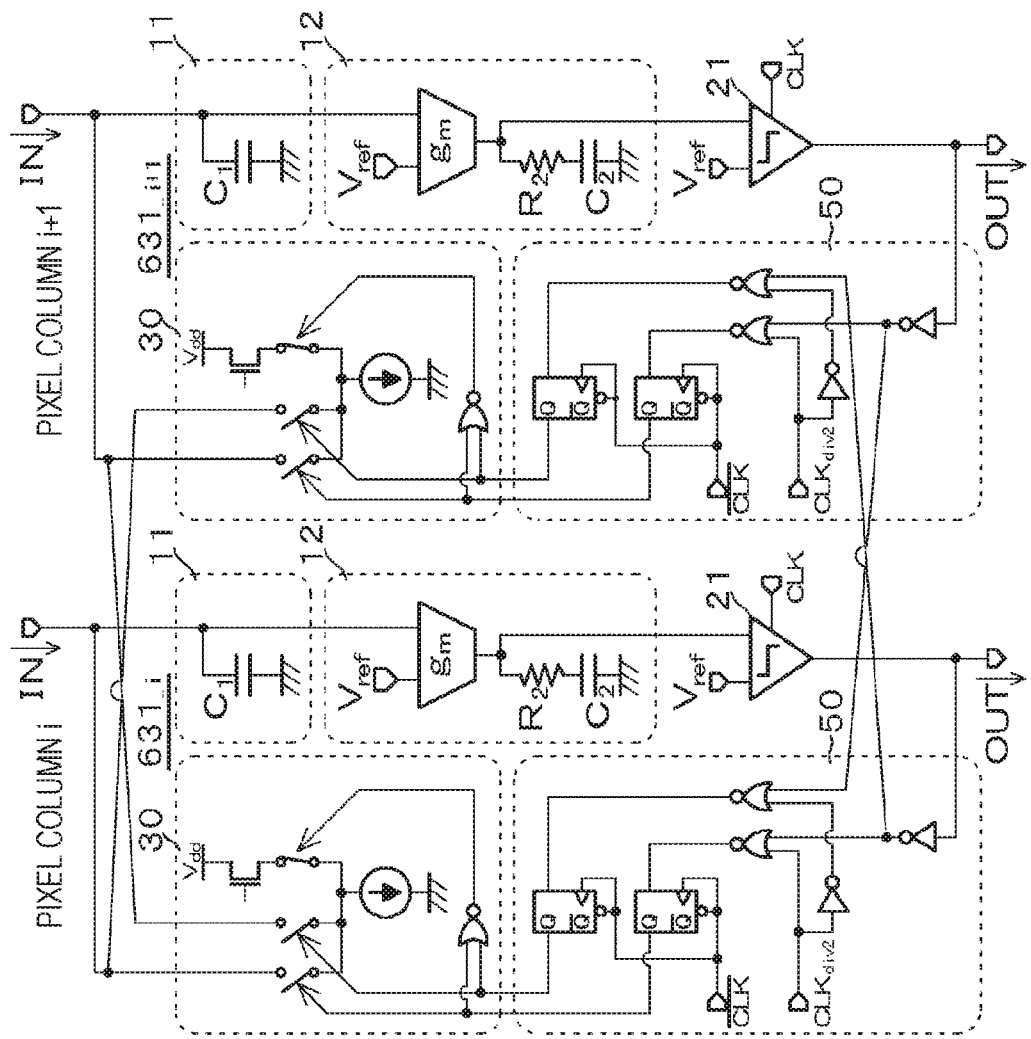
FIG. 13 is a circuit diagram illustrating an overview of a circuit configuration of a continuous-time delta-sigma analog-digital converter according to Example 7.

Example 7 is an example of using as the second current-steering digital-analog converting unit 40 a current-steering digital-analog converting unit belonging to the analog-digital converter 631 on an adjacent pixel column. An overview of a circuit configuration of a continuous-time delta-sigma analog-digital converter according to Example 7 is illustrated in FIG. 13.

Here, description will be provided by taking as an example a case where, in the column processing unit 63, the analog-digital converters 631 are arranged to have a one-to-one correspondence relationship to the pixel columns of the pixel array unit 61, for example. Note that, in FIG. 13, for simplification of the figure, two analog-digital converters 631$_{-i}$ and 631$_{-i+1}$ corresponding to two pixel columns including a certain pixel column i and a pixel column i+1 adjacent to the pixel column i are illustrated.

The analog-digital converter 631$_{-i}$ on the pixel column i uses as the second current-steering digital-analog converting unit 40 the first current-steering digital-analog converting unit 30 belonging to the analog-digital converter 631$_{-i+1}$ on the adjacent pixel column i+1. Also, in the analog-digital converter 631$_{-i}$ on the pixel column i, destinations of feedback values output from the first current-steering digital-analog converting unit 30 belonging to the analog-digital converter 631$_{-i}$ itself and the first current-steering digital-analog converting unit 30 belonging to the adjacent analog-digital converter 631$_{-i+1}$ are switched each time of feedback under control by means of the control circuit unit 50.

The analog-digital converter 631$_{-i+1}$ on the pixel column i+1 has the inverse thereof. That is, the analog-digital converter 631$_{-i+1}$ uses as the second current-steering digital-analog converting unit 40 the first current-steering digital-analog converting unit 30 belonging to the analog-digital converter 631$_{-i}$ on the adjacent pixel column i. Also, in the analog-digital converter 631$_{-i+1}$ on the pixel column i+1, destinations of the feedback values output from the first current-steering digital-analog converting unit 30 belonging to the analog-digital converter 631$_{-i+1}$ itself and the first current-steering digital-analog converting unit 30 belonging to the adjacent analog-digital converter 631$_{-i}$ are switched each time of feedback under control by means of the control circuit unit 50.

In the delta-sigma analog-digital converter according to Example 7 configured as above, a case where the random telegraph noise at the current source of either the analog-digital converter 631$_{-i}$ or the analog-digital converter 631$_{-i+1}$ on the adjacent pixel columns is particularly high is considered. In this case, according to Example 7, since the half-reduced random telegraph noise is output from both the analog-digital converters 631$_{-i}$ and 631$_{-i+1}$ on the two pixel columns, and degradation of image quality resulting from the random telegraph noise is less noticeable, image quality of a captured image can be improved.

Note that, in Example 7, although the case where the present disclosure has been applied to a delta-sigma analog-digital converter which is in a type of originally including only one current-steering digital-analog converting unit (first current-steering digital-analog converting unit 30) in a feedback loop has been described as an example, the present disclosure is not limited to this. In other words, as in the case of Example 1 or the like, the present disclosure can be applied to a delta-sigma analog-digital converter which is in a type of including the first current-steering digital-analog converting unit 30 and the second current-steering digital-analog converting unit 40.

Furthermore, a mode of combining switching in the analog-digital converter 631 on a single pixel column according to Example 1 to Example 6 with switching between the analog-digital converters 631 on adjacent pixel columns according to Example 7 can be available.

Furthermore, although, in Example 7, the case where, in a case where the analog-digital converters 631 are arranged on the respective pixel columns, the current-steering digital-analog converting unit belonging to the analog-digital converter on the adjacent pixel column is used as the second current-steering digital-analog converting unit 40 has been described above as an example, the present disclosure is not limited to this. Specifically, there is a case where the analog-digital converters 631 are provided per group of a plurality of pixel columns, and in this case, the current-steering digital-analog converting unit belonging to the adjacent analog-digital converter in the column processing unit 63 is used as the second current-steering digital-analog converting unit 40.

Note that the aforementioned system configuration of the CMOS image sensor 60 is illustrative only, and the present disclosure is not limited to this. An available system configuration example is a system configuration in which the data storage unit 69 is arranged at the downstream of the column processing unit 63 and in which a pixel signal output from the column processing unit 63 is supplied via the data storage unit 69 to the signal processing unit 68. Another available system configuration example is a system configuration in which the data storage unit 69 and the signal processing unit 68 are provided in parallel with the column processing unit 63.

[Stacked Structure]

Figure 14:
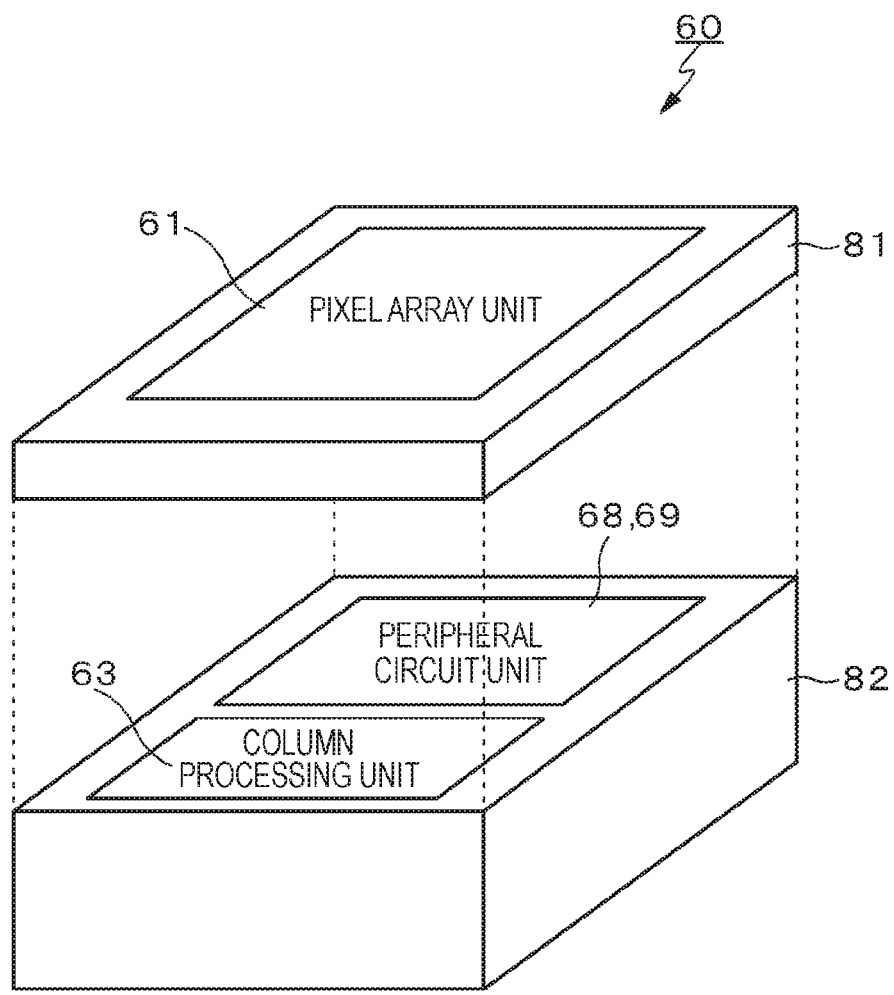
FIG. 14 is an exploded perspective view illustrating an overview of a structure of a stacked CMOS image sensor.

Furthermore, the aforementioned CMOS image sensor 60 has been described above by taking as an example a so-called horizontally-placed CMOS image sensor, in which peripheral circuit unit including the column processing unit 63 including the analog-digital converters 631, the signal processing unit 68, and the like is formed on the same semiconductor substrate as the pixel array unit 61, but the present disclosure is not limited to application to the horizontally-placed CMOS image sensor. That is, the present disclosure can be applied to a so-called stacked CMOS image sensor in which a plurality of semiconductor substrates is mutually stacked. As one specific example of the stacked structure can be raised, as illustrated in FIG. 14, a stacked structure in which a semiconductor substrate 81 provided with the pixel array unit 61 and a semiconductor substrate 82 provided with the column processing unit 63 including the analog-digital converters 631 and the peripheral circuit unit including the signal processing unit 68, the data storage unit 69, and the like are stacked, for example.

According to the stacked CMOS image sensor 60, since (the area of) the semiconductor substrate 81 on the first layer can be as large as to form the pixel array unit 61, the size (area) of the semiconductor substrate 81 on the first layer and the size of the entire chip can be reduced. Moreover, since a process appropriate for formation of the pixels can be applied to the semiconductor substrate 81 on the first layer, and a process appropriate for formation of the circuits can be applied to the semiconductor substrate 82 on the second layer, there is a merit of optimizing the process for manufacturing the CMOS image sensor 60.

Note that, although the two-layer stacked structure has been illustrated here, the number of layers in the stacked structure is not limited to two and may be three or more.

<Electronic System According to Present Disclosure>

The aforementioned solid-state image sensing device according to the present disclosure can be used as an image sensing unit (image capturing unit) in various electronic systems such as an image sensing apparatus such as a digital still camera and a video camera, a portable terminal apparatus having an image sensing function such as a portable phone, and a copying machine using a solid-state image sensing device for an image reading unit. Note that the solid-state image sensing device may be formed in a chip state or in a module state having an image sensing function in which an image sensing unit and a signal processing unit or an optical system are integrally packaged. The aforementioned module-state device mounted in an electronic system, that is, a camera module, is used as an image sensing apparatus in some cases.

[Image Sensing Apparatus]

Figure 15:
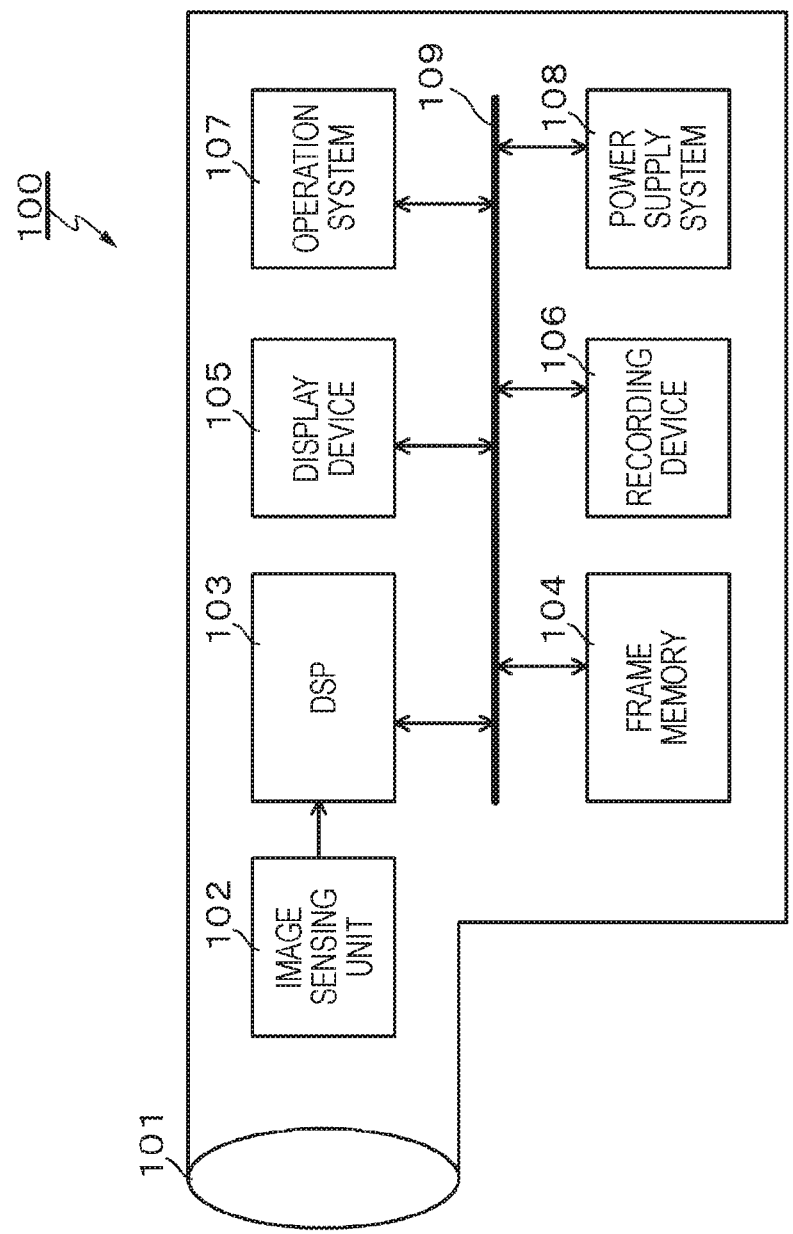
FIG. 15 is a block diagram illustrating a configuration of an image sensing apparatus as an example of an electronic system according to the present disclosure.

FIG. 15 is a block diagram illustrating a configuration of an image sensing apparatus as an example of an electronic system according to the present disclosure. As illustrated in FIG. 15, an image sensing apparatus 100 according to the present example includes an image sensing optical system 101 including a lens group and the like, an image sensing unit 102, a DSP circuit 103, a frame memory 104, a display device 105, a recording device 106, an operation system 107, a power supply system 108, and the like. Also, the image sensing apparatus 100 has a configuration in which the DSP circuit 103, the frame memory 104, the display device 105, the recording device 106, the operation system 107, and the power supply system 108 are connected to each other via a bus line 109.

The image sensing optical system 101 captures incident light (image light) from a subject and forms an image thereof on an image sensing surface of the image sensing unit 102. The image sensing unit 102 converts the light quantity of the incident light whose image has been formed on the image sensing surface by the optical system 101 into an electric signal per pixel and outputs the electric signal as a pixel signal. The DSP circuit 103 performs general camera signal processing such as white balance processing, demosaicing processing, and gamma correction processing, for example.

The frame memory 104 is used as needed for storage of data in the process of the signal processing in the DSP circuit 103. The display device 105 includes a panel-type display device such as a liquid crystal display device and an electro luminescence (EL) display device and displays a moving image or a still image captured at the image sensing unit 102. The recording device 106 records the moving image or the still image captured at the image sensing unit 102 in a recording medium such as a portable semiconductor memory, an optical disk, and a hard disk drive (HDD).

The operation system 107 generates operation commands regarding various functions that the image sensing apparatus 100 has under operation by means of a user. The power supply system 108 supplies various kinds of power serving as operation power for the DSP circuit 103, the frame memory 104, the display device 105, the recording device 106, and the operation system 107 to these supply destinations as needed.

In the image sensing apparatus 100 configured as above, the aforementioned CMOS image sensor 60 according to the present disclosure can be used as the image sensing unit 102. Since the CMOS image sensor 60 according to the present disclosure can reduce the random telegraph noise, image quality can be improved. Accordingly, by using the CMOS image sensor 60 according to the present disclosure as the image sensing unit 102, image quality of a captured image can be improved.

Furthermore, in the CMOS image sensor 60 according to the present disclosure, since the extent of reduction of the random noise can be applied to the size reduction of the current source transistor, the size of the column processing unit 63 and the chip size of the CMOS image sensor 60 can be reduced along with size reduction of the analog-digital converter 631. Accordingly, using the CMOS image sensor 60 according to the present disclosure as the image sensing unit 102 can contribute to size reduction of the image sensing optical system including the image sensing unit 102.

<Configurations that Present Disclosure can Employ>

Note that the present disclosure can also employ the following configurations.

<<A. Analog-Digital Converter>>

[A-1] An analog-digital converter including:

an integration circuit unit integrating a difference between a value of an analog input signal and a feedback value;

a quantization circuit unit converting an output of the integration circuit unit into a digital value;

a first current-steering digital-analog converting unit generating the feedback value in accordance with an output of the quantization circuit unit; and a second current-steering digital-analog converting unit differing from the first current-steering digital-analog converting unit, in which an output terminal of the first current-steering digital-analog converting unit or an output terminal of the second current-steering digital-analog converting unit is connected to an input terminal of the integration circuit unit.

[A-2] The analog-digital converter according to the above [A-1], in which the second current-steering digital-analog converting unit is provided in the same analog-digital converter as the analog-digital converter provided with the first current-steering digital-analog converting unit.

[A-3] The analog-digital converter according to the above [A-2], in which the integration circuit unit includes at least two integrators connected in a cascaded manner, the first current-steering digital-analog converting unit is a digital-analog converting unit giving the feedback value to the integrator on a first stage of the integration circuit unit, and the second current-steering digital-analog converting unit is a digital-analog converting unit giving the feedback value to the integrator on a second stage of the integration circuit unit.

[A-4] The analog-digital converter according to the above [A-3], in which the first current-steering digital-analog converting unit includes a first switch element selectively connected at the output terminal thereof to the integrator on the first stage and a second switch element selectively connected at the output terminal thereof to the integrator on the second stage, and the second current-steering digital-analog converting unit includes a third switch element selectively connected at the output terminal thereof to the integrator on the second stage and a fourth switch element selectively connected at the output terminal thereof to the integrator on the first stage.

[A-5] The analog-digital converter according to the above [A-4], further including:

a control circuit unit performing switching control between a first connection mode in which the output terminal of the first current-steering digital-analog converting unit is connected to the integrator on the first stage via the first switch element and in which the output terminal of the second current-steering digital-analog converting unit is connected to the integrator on the second stage via the third switch element, and a second connection mode in which the output terminal of the first current-steering digital-analog converting unit is connected to the integrator on the second stage via the second switch element and in which the output terminal of the second current-steering digital-analog converting unit is connected to the integrator on the first stage via the fourth switch element.

[A-6] The analog-digital converter according to the above [A-5], in which the control circuit unit performs the switching control between the first connection mode and the second connection mode in an alternate manner in synchronization with quantization operation of the quantization circuit unit.

[A-7] The analog-digital converter according to the above [A-2], in which the output terminal of the first current-steering digital-analog converting unit or the second current-steering digital-analog converting unit, whichever generates a lower random telegraph noise, is connected to the input terminal of the integration circuit unit in a fixed manner.

[A-8] The analog-digital converter according to the above [A-7], in which a switch circuit part of the first current-steering digital-analog converting unit is used in common by the first current-steering digital-analog converting unit and the second current-steering digital-analog converting unit.

[A-9] The analog-digital converter according to the above [A-1], in which the second current-steering digital-analog converting unit is provided in an analog-digital converter adjacent to the analog-digital converter provided with the first current-steering digital-analog converting unit.

<<B. Solid-State Image Sensing Device>>

[B-1] A solid-state image sensing device including:

a pixel array unit including unit pixels each including a photoelectric conversion unit arranged in a matrix form; and a column processing unit including an analog-digital converter converting an analog pixel signal output from the unit pixel into a digital pixel signal, in which the analog-digital converter includes:

an integration circuit unit integrating a difference between a value of the analog pixel signal and a feedback value;

a quantization circuit unit converting an output of the integration circuit unit into a digital value;

a first current-steering digital-analog converting unit generating the feedback value in accordance with an output of the quantization circuit unit; and a second current-steering digital-analog converting unit differing from the first current-steering digital-analog converting unit, and an output terminal of the first current-steering digital-analog converting unit or an output terminal of the second current-steering digital-analog converting unit is connected to an input terminal of the integration circuit unit.

[B-2] The solid-state image sensing device according to the above [B-1], in which the second current-steering digital-analog converting unit is provided in the same analog-digital converter as the analog-digital converter provided with the first current-steering digital-analog converting unit.

[B-3] The solid-state image sensing device according to the above [B-2], in which the integration circuit unit includes at least two integrators connected in a cascaded manner, the first current-steering digital-analog converting unit is a digital-analog converting unit giving the feedback value to the integrator on a first stage of the integration circuit unit, and the second current-steering digital-analog converting unit is a digital-analog converting unit giving the feedback value to the integrator on a second stage of the integration circuit unit.

[B-4] The solid-state image sensing device according to the above [B-3], in which the first current-steering digital-analog converting unit includes a first switch element selectively connected at the output terminal thereof to the integrator on the first stage and a second switch element selectively connected at the output terminal thereof to the integrator on the second stage, and the second current-steering digital-analog converting unit includes a third switch element selectively connected at the output terminal thereof to the integrator on the second stage and a fourth switch element selectively connected at the output terminal thereof to the integrator on the first stage.

[B-5] The solid-state image sensing device according to the above [B-4], further including:

a control circuit unit performing switching control between a first connection mode in which the output terminal of the first current-steering digital-analog converting unit is connected to the integrator on the first stage via the first switch element and in which the output terminal of the second current-steering digital-analog converting unit is connected to the integrator on the second stage via the third switch element, and a second connection mode in which the output terminal of the first current-steering digital-analog converting unit is connected to the integrator on the second stage via the second switch element and in which the output terminal of the second current-steering digital-analog converting unit is connected to the integrator on the first stage via the fourth switch element.

[B-6] The solid-state image sensing device according to the above [B-5], in which the control circuit unit performs the switching control between the first connection mode and the second connection mode in an alternate manner in synchronization with quantization operation of the quantization circuit unit.

[B-7] The solid-state image sensing device according to the above [B-4], in which the output terminal of the first current-steering digital-analog converting unit or the second current-steering digital-analog converting unit, whichever generates a lower random telegraph noise, is connected to the input terminal of the integration circuit unit in a fixed manner.

[B-8] The solid-state image sensing device according to the above [B-7], in which a switch circuit part of the first current-steering digital-analog converting unit is used in common by the first current-steering digital-analog converting unit and the second current-steering digital-analog converting unit.

[B-9] The solid-state image sensing device according to the above [B-1], in which the second current-steering digital-analog converting unit is provided in an adjacent analog-digital converter in the column processing unit.

[B-10] The solid-state image sensing device according to any one of the above [B-1] to [B-9], in which a semiconductor substrate provided with the pixel array unit and a semiconductor substrate provided with the column processing unit including the analog-digital converter are stacked.

<<C. Electronic System>>

[C-1] An electronic system including:
a solid-state image sensing device,
in which the solid-state image sensing device includes:
a pixel array unit including unit pixels each including a photoelectric conversion unit arranged in a matrix form; and
a column processing unit including an analog-digital converter converting an analog pixel signal output from the unit pixel into a digital pixel signal, the analog-digital converter includes:
an integration circuit unit integrating a difference between a value of the analog pixel signal and a feedback value;
a quantization circuit unit converting an output of the integration circuit unit into a digital value;
a first current-steering digital-analog converting unit generating the feedback value in accordance with an output of the quantization circuit unit; and
a second current-steering digital-analog converting unit differing from the first current-steering digital-analog converting unit, and
an output terminal of the first current-steering digital-analog converting unit or an output terminal of the second current-steering digital-analog converting unit is connected to an input terminal of the integration circuit unit.

[C-2] The electronic system according to the above [C-1], in which the second current-steering digital-analog converting unit is provided in the same analog-digital converter as the analog-digital converter provided with the first current-steering digital-analog converting unit.

[C-3] The electronic system according to the above [C-2], in which the integration circuit unit includes at least two integrators connected in a cascaded manner, the first current-steering digital-analog converting unit is a digital-analog converting unit giving the feedback value to the integrator on a first stage of the integration circuit unit, and the second current-steering digital-analog converting unit is a digital-analog converting unit giving the feedback value to the integrator on a second stage of the integration circuit unit.

[C-4] The electronic system according to the above [C-3], in which the first current-steering digital-analog converting unit includes a first switch element selectively connected at the output terminal thereof to the integrator on the first stage and a second switch element selectively connected at the output terminal thereof to the integrator on the second stage, and the second current-steering digital-analog converting unit includes a third switch element selectively connected at the output terminal thereof to the integrator on the second stage and a fourth switch element selectively connected at the output terminal thereof to the integrator on the first stage.

[C-5] The electronic system according to the above [C-4], further including:

a control circuit unit performing switching control between a first connection mode in which the output terminal of the first current-steering digital-analog converting unit is connected to the integrator on the first stage via the first switch element and in which the output terminal of the second current-steering digital-analog converting unit is connected to the integrator on the second stage via the third switch element, and a second connection mode in which the output terminal of the first current-steering digital-analog converting unit is connected to the integrator on the second stage via the second switch element and in which the output terminal of the second current-steering digital-analog converting unit is connected to the integrator on the first stage via the fourth switch element.

[C-6] The electronic system according to the above [C-5], in which the control circuit unit performs the switching control between the first connection mode and the second connection mode in an alternate manner in synchronization with quantization operation of the quantization circuit unit.

[C-7] The electronic system according to the above [C-4], in which the output terminal of the first current-steering digital-analog converting unit or the second current-steering digital-analog converting unit, whichever generates a lower random telegraph noise, is connected to the input terminal of the integration circuit unit in a fixed manner.

[C-8] The electronic system according to the above [C-7], in which a switch circuit part of the first current-steering digital-analog converting unit is used in common by the first current-steering digital-analog converting unit and the second current-steering digital-analog converting unit.

[C-9] The electronic system according to the above [C-1], in which the second current-steering digital-analog converting unit is provided in an adjacent analog-digital converter in the column processing unit.

[C-10] The electronic system according to any one of the above [C-1] to [C-9], in which a semiconductor substrate provided with the pixel array unit and a semiconductor substrate provided with the column processing unit including the analog-digital converter are stacked.

REFERENCE SIGNS LIST

1 Continuous-time delta-sigma analog-digital converter
10 Integration circuit unit
11 First-stage integrator
12 Second-stage integrator
13 Third-stage integrator
20 Quantization circuit unit
21 Comparator
30 First current-steering digital-analog converting unit
31 First switch element
32 Second switch element
40 Second current-steering digital-analog converting unit
41 Third switch element
42 Fourth switch element
50 Control circuit unit
60 CMOS image sensor
61 Pixel array unit
62 Vertical driving unit
63 Column processing unit
64 Horizontal driving unit
65 System control unit
66($66_1$ to $66_m$) Pixel driving line
67($67_1$ to $17_n$) Vertical signal line
68 Signal processing unit
69 Data storage unit
70 Unit pixel
$I_1$ Current source of first current-steering digital-analog converting unit
$I_2$ Current source of second current-steering digital-analog converting unit

The invention claimed is:

1. An analog-digital converter, comprising:
an integration circuit unit configured to integrate a difference between a value of an analog input signal and a feedback value;
a quantization circuit unit configured to convert an output of the integration circuit unit into a digital value;
a first current-steering digital-analog converting unit configured to generate the feedback value based on an output of the quantization circuit unit; and
a second current-steering digital-analog converting unit which is different from the first current-steering digital-analog converting unit, wherein one of an output terminal of the first current-steering digital-analog converting unit or an output terminal of the second current-steering digital-analog converting unit is connected to an input terminal of the integration circuit unit, and
one, which has a lowest telegraph noise, of the first current-steering digital-analog converting unit or the second current-steering digital-analog converting unit is connected to the input terminal of the integration circuit unit.

2. The analog-digital converter according to claim 1, wherein
the integration circuit unit includes at least two integrators connected in a cascaded manner,
the first current-steering digital-analog converting unit is further configured to provide the feedback value to a first integrator on a first stage of the integration circuit unit, and
the second current-steering digital-analog converting unit is further configured to provide the feedback value to a second integrator on a second stage of the integration circuit unit.

3. The analog-digital converter according to claim 2, wherein
the first current-steering digital-analog converting unit includes:
a first switch element selectively connected at the output terminal of the first current-steering digital-analog converting unit to the first integrator on the first stage; and
a second switch element selectively connected at the output terminal of the first current-steering digital-analog converting unit to the second integrator on the second stage, and
the second current-steering digital-analog converting unit includes:
a third switch element selectively connected at the output terminal of the second current-steering digital-analog converting unit to the second integrator on the second stage; and
a fourth switch element selectively connected at the output terminal of the second current-steering digital-analog converting unit to the first integrator on the first stage.

4. The analog-digital converter according to claim 3, further comprising:
a control circuit unit configured to switch between:
a first connection mode in which:
the output terminal of the first current-steering digital-analog converting unit is connected to the first integrator on the first stage via the first switch element, and
the output terminal of the second current-steering digital-analog converting unit is connected to the second integrator on the second stage via the third switch element, and
a second connection mode in which:
the output terminal of the first current-steering digital-analog converting unit is connected to the second integrator on the second stage via the second switch element, and
the output terminal of the second current-steering digital-analog converting unit is connected to the first integrator on the first stage via the fourth switch element.

5. The analog-digital converter according to claim 4, wherein the control circuit unit is configured to switch between the first connection mode and the second connection mode in an alternate manner in synchronization with a quantization operation of the quantization circuit unit.

6. The analog-digital converter according to claim 1, wherein a switch circuit part of the first current-steering digital-analog converting unit is used by the first current-steering digital-analog converting unit and the second current-steering digital-analog converting unit.

7. A solid-state image sensing device, comprising:
a pixel array unit including a plurality of unit pixels, each unit pixel of the plurality of unit pixels includes a photoelectric conversion unit, arranged in a matrix form; and
a column processing unit including:
an analog-digital converter configured to convert an analog pixel signal output from a unit pixel, of the plurality of unit pixels, into a digital pixel signal, wherein the analog-digital converter includes:
an integration circuit unit configured to a difference between a value of the analog pixel signal and a feedback value;
a quantization circuit unit configured to convert an output of the integration circuit unit into a digital value;
a first current-steering digital-analog converting unit configured to generate the feedback value based on an output of the quantization circuit unit; and
a second current-steering digital-analog converting unit which is different from the first current-steering digital-analog converting unit, wherein
one of an output terminal of the first current-steering digital-analog converting unit or an output terminal of the second current-steering digital-analog converting unit is connected to an input terminal of the integration circuit unit, and
one, which has a lowest telegraph noise, of the first current-steering digital-analog converting unit or the second current-steering digital-analog converting unit is connected to the input terminal of the integration circuit unit.

8. The solid-state image sensing device according to claim 7, wherein
the integration circuit unit includes at least two integrators connected in a cascaded manner,
the first current-steering digital-analog converting unit is further configured to provide the feedback value to a first integrator on a first stage of the integration circuit unit, and
the second current-steering digital-analog converting unit is further configured to provide the feedback value to a second integrator on a second stage of the integration circuit unit.

9. The solid-state image sensing device according to claim 8, wherein
the first current-steering digital-analog converting unit includes:
a first switch element selectively connected at the output terminal of the first current-steering digital-analog converting unit to the first integrator on the first stage, and
a second switch element selectively connected at the output terminal of the first current-steering digital-analog converting unit to the second integrator on the second stage, and the second current-steering digital-analog converting unit includes:
a third switch element selectively connected at the output terminal of the second current-steering digital-analog converting unit to the second integrator on the second stage, and
a fourth switch element selectively connected at the output terminal of the second current-steering digital-analog converting unit to the first integrator on the first stage.

10. The solid-state image sensing device according to claim 9, further comprising:
a control circuit unit configured to switch between:
a first connection mode in which:
the output terminal of the first current-steering digital-analog converting unit is connected to the first integrator on the first stage via the first switch element, and
the output terminal of the second current-steering digital-analog converting unit is connected to the second integrator on the second stage via the third switch element, and
a second connection mode in which:
the output terminal of the first current-steering digital-analog converting unit is connected to the second integrator on the second stage via the second switch element, and
the output terminal of the second current-steering digital-analog converting unit is connected to the first integrator on the first stage via the fourth switch element.

11. The solid-state image sensing device according to claim 10, wherein the control circuit unit is configured to switch between the first connection mode and the second connection mode in an alternate manner in synchronization with a quantization operation of the quantization circuit unit.

12. The solid-state image sensing device according to claim 7, wherein a switch circuit part of the first current-steering digital-analog converting unit is used by the first current-steering digital-analog converting unit and the second current-steering digital-analog converting unit.

13. The solid-state image sensing device according to claim 7, wherein a semiconductor substrate provided with the pixel array unit and a semiconductor substrate provided with the column processing unit including the analog-digital converter are stacked.

14. An electronic system, comprising:
a solid-state image sensing device, wherein the solid-state image sensing device includes:
a pixel array unit including a plurality of unit pixels, each unit pixel of the plurality of unit pixels includes a photoelectric conversion unit, arranged in a matrix form; and
a column processing unit including:
an analog-digital converter configured to convert an analog pixel signal output from a unit pixel, of the plurality of unit pixels, into a digital pixel signal, wherein the analog-digital converter includes:
an integration circuit unit configured to integrate a difference between a value of the analog pixel signal and a feedback value;
a quantization circuit unit configured to convert an output of the integration circuit unit into a digital value;
a first current-steering digital-analog converting unit configured to generate the feedback value based on an output of the quantization circuit unit; and a second current-steering digital-analog converting unit which is different from the first current-steering digital-analog converting unit, wherein one of an output terminal of the first current-steering digital-analog converting unit or an output terminal of the second current-steering digital-analog converting unit is connected to an input terminal of the integration circuit unit; and one, which has a lowest telegraph noise, of the first current-steering digital-analog converting unit or the second current-steering digital-analog converting unit is connected to the input terminal of the integration circuit unit.

* * * * *